US008853819B2

(12) United States Patent
Chen et al.

(10) Patent No.: US 8,853,819 B2
(45) Date of Patent: Oct. 7, 2014

(54) SEMICONDUCTOR STRUCTURE WITH PASSIVE ELEMENT NETWORK AND MANUFACTURING METHOD THEREOF

(75) Inventors: Chien-Hua Chen, Pingtung (TW); Teck-Chong Lee, Kaohsiung (TW); Hsu-Chiang Shih, Kaohsiung (TW); Meng-Wei Hsieh, Tainan (TW)

(73) Assignee: Advanced Semiconductor Engineering, Inc. (TW)

( * ) Notice: Subject to any disclaimer, the term of this patent is extended or adjusted under 35 U.S.C. 154(b) by 180 days.

(21) Appl. No.: 13/338,087

(22) Filed: Dec. 27, 2011

(65) Prior Publication Data

US 2012/0175731 A1 Jul. 12, 2012

(30) Foreign Application Priority Data

Jan. 7, 2011 (TW) ................................ 100100719
Jan. 12, 2011 (TW) ................................ 100101155
Nov. 22, 2011 (TW) ................................ 100142771

(51) Int. Cl.

| | |
|---|---|
| ***H01L 27/08*** | (2006.01) |
| ***H01L 23/498*** | (2006.01) |
| ***H01L 49/02*** | (2006.01) |
| ***H01L 23/64*** | (2006.01) |
| ***H01L 23/522*** | (2006.01) |
| ***H01L 23/14*** | (2006.01) |
| ***H01L 27/01*** | (2006.01) |
| ***H01L 25/065*** | (2006.01) |
| ***H01L 21/768*** | (2006.01) |
| *H01L 23/60* | (2006.01) |

(52) U.S. Cl.

CPC ........ *H01L 27/016* (2013.01); *H01L 23/49827* (2013.01); *H01L 28/20* (2013.01); *H01L 23/64* (2013.01); *H01L 2225/06572* (2013.01); *H01L 23/5228* (2013.01); *H01L 23/60* (2013.01); *H01L 23/49822* (2013.01); *H01L 23/147* (2013.01); *H01L 2224/16* (2013.01); *H01L 23/5227* (2013.01); *H01L 28/40* (2013.01); *H01L 25/0657* (2013.01); *H01L 2225/06517* (2013.01); *H01L 28/10* (2013.01); *H01L 21/76898* (2013.01)

USPC ............ 257/531; 257/E29.002; 257/E21.004; 438/382

(58) Field of Classification Search

USPC .......................................... 257/531; 438/382
See application file for complete search history.

(56) References Cited

U.S. PATENT DOCUMENTS 3,761,782 A 9/1973 Youmans
3,781,610 A 12/1973 Bodway (Continued)

FOREIGN PATENT DOCUMENTS

CN 102136430 A 7/2011
JP 2002246540 A 8/2002

(Continued)

*Primary Examiner* — Ahmed Sefer
(74) *Attorney, Agent, or Firm* — Morgan Law Offices, PLC

(57) ABSTRACT

The present invention relates to a semiconductor structure having an integrated passive network and a method for making the same. The semiconductor structure includes a substrate which can be an interposer. The substrate can include a plurality of conductive vias. In various embodiments, the substrate includes a dielectric layer disposed thereon, the dielectric layer having an opening forming a straight hole allowing electrical connection between the passive network and the conductive via. The passive network includes a series of patterned dielectric and conductive layers, forming passive electronic components. In an embodiment, the passive device includes a common resistor coupled to a pair of inductors, each of the inductors coupled to a capacitor. In another embodiment, the passive device includes a resistor and an inductor electrically connected to each other, a bottom surface of the inductor coplanar with a bottom surface of the resistor.

20 Claims, 29 Drawing Sheets

(56) References Cited

U.S. PATENT DOCUMENTS 4,020,222 A 4/1977 Kausche et al.
4,038,167 A 7/1977 Young
4,059,708 A 11/1977 Heiss et al.
4,385,966 A 5/1983 Keller et al.
4,394,712 A 7/1983 Anthony
4,410,867 A 10/1983 Arcidiacono et al.
4,499,655 A 2/1985 Anthony
4,807,021 A 2/1989 Okumura
4,842,699 A 6/1989 Hua et al.
4,897,708 A 1/1990 Clements
4,982,265 A 1/1991 Watanabe et al.
5,166,097 A 11/1992 Tanielian
5,191,405 A 3/1993 Tomita et al.
5,229,647 A 7/1993 Gnadinger
5,239,448 A 8/1993 Perkins et al.
5,308,443 A 5/1994 Sugihara
5,404,044 A 4/1995 Booth et al.
5,615,477 A 4/1997 Sweitzer
5,643,831 A 7/1997 Ochiai et al.
5,872,696 A 2/1999 Peters et al.
5,948,216 A 9/1999 Cava et al.
5,977,582 A 11/1999 Fleming et al.
5,998,292 A 12/1999 Black et al.
6,075,691 A 6/2000 Duenas et al.
6,276,599 B1 8/2001 Ogawa
6,329,631 B1 12/2001 Yueh
6,406,934 B1 6/2002 Glenn et al.
6,448,506 B1 9/2002 Glenn et al.
6,457,633 B1 10/2002 Takashima et al.
6,495,912 B1 * 12/2002 Huang et al. .................. 257/700
6,577,013 B1 6/2003 Glenn et al.
6,670,269 B2 12/2003 Mashino
6,699,787 B2 3/2004 Mashino
6,740,950 B2 5/2004 Paek
6,761,963 B2 7/2004 Casper et al.
6,812,549 B2 11/2004 Umetsu et al.
6,815,348 B2 11/2004 Mashino
6,890,629 B2 5/2005 Casper et al.
6,962,829 B2 11/2005 Glenn et al.
6,998,696 B2 2/2006 Casper et al.
7,078,269 B2 7/2006 Yamasaki et al.
7,134,198 B2 11/2006 Nakatani
7,157,372 B1 1/2007 Trezza
7,215,032 B2 5/2007 Trezza
7,222,420 B2 5/2007 Moriizumi
7,227,736 B2 6/2007 Shioga et al.
7,238,590 B2 7/2007 Yang et al.
7,259,077 B2 8/2007 Degani et al.
7,262,475 B2 8/2007 Kwon et al.
7,276,787 B2 10/2007 Edelstein et al.
7,285,434 B2 10/2007 Yee et al.
7,298,030 B2 11/2007 McWilliams et al.
7,327,582 B2 2/2008 Casper et al.
7,334,326 B1 2/2008 Huemoeller et al.
7,365,436 B2 4/2008 Yamano
7,371,602 B2 5/2008 Yee
7,388,293 B2 6/2008 Fukase et al.
7,415,762 B2 8/2008 Fukase et al.
7,446,388 B2 11/2008 Casper et al.
7,482,272 B2 1/2009 Trezza
7,508,057 B2 3/2009 Shiraishi et al.
7,508,079 B2 3/2009 Higashi
7,528,053 B2 5/2009 Huang et al.
7,538,033 B2 5/2009 Trezza
7,553,752 B2 6/2009 Kuan et al.
7,557,423 B2 7/2009 Ching et al.
7,560,744 B2 7/2009 Hsiao et al.
7,598,163 B2 10/2009 Callahan et al.
7,605,463 B2 10/2009 Sunohara
7,625,818 B2 12/2009 Wang
7,642,132 B2 1/2010 Huang et al.
7,656,023 B2 2/2010 Sunohara et al.
7,659,202 B2 2/2010 Trezza
7,666,711 B2 2/2010 Pagaila et al.
7,678,685 B2 3/2010 Sunohara et al.
7,681,779 B2 3/2010 Yang
7,687,397 B2 3/2010 Trezza
7,691,747 B2 4/2010 Lin et al.
7,733,661 B2 6/2010 Kossives et al.
7,741,148 B1 6/2010 Marimuthu et al.
7,741,152 B2 6/2010 Huang et al.
7,741,156 B2 6/2010 Pagaila et al.
7,772,081 B2 8/2010 Lin et al.
7,772,118 B2 8/2010 Yamano
7,786,008 B2 8/2010 Do et al.
7,786,592 B2 8/2010 Trezza
7,795,140 B2 9/2010 Taguchi et al.
7,808,060 B2 10/2010 Hsiao
7,808,111 B2 10/2010 Trezza
7,811,858 B2 10/2010 Wang et al.
7,816,265 B2 10/2010 Wang
7,842,597 B2 11/2010 Tsai
7,858,441 B2 12/2010 Lin et al.
2002/0017855 A1 2/2002 Cooper et al.
2002/0094605 A1 7/2002 Pai et al.
2004/0124518 A1 7/2004 Karnezos
2004/0245580 A1 12/2004 Lin
2004/0259292 A1 12/2004 Beyne et al.
2005/0189635 A1 9/2005 Humpston et al.
2005/0258545 A1 11/2005 Kwon
2006/0017133 A1 * 1/2006 Oi et al. ........................ 257/528
2006/0027632 A1 2/2006 Akram
2006/0197216 A1 9/2006 Yee
2007/0048896 A1 3/2007 Andry et al.
2007/0138562 A1 6/2007 Trezza
2007/0187711 A1 8/2007 Hsiao et al.
2008/0272486 A1 11/2008 Wang et al.
2009/0032928 A1 2/2009 Chiang et al.
2009/0039527 A1 2/2009 Chan et al.
2009/0090995 A1 4/2009 Yang et al.
2009/0140383 A1 6/2009 Chang et al.
2009/0140436 A1 6/2009 Wang
2009/0146297 A1 6/2009 Badakere et al.
2009/0166785 A1 7/2009 Camacho et al.
2009/0243045 A1 10/2009 Pagaila et al.
2009/0294959 A1 12/2009 Chiang et al.
2009/0302435 A1 12/2009 Pagaila et al.
2009/0302437 A1 12/2009 Kim et al.
2009/0309235 A1 12/2009 Suthiwongsunthorn et al.
2009/0321916 A1 12/2009 Wang et al.
2010/0059855 A1 3/2010 Lin et al.
2010/0065948 A1 3/2010 Bae et al.
2010/0133704 A1 6/2010 Marimuthu et al.
2010/0140737 A1 6/2010 Lin et al.
2010/0140751 A1 6/2010 Tay et al.
2010/0140752 A1 6/2010 Marimuthu et al.
2010/0140776 A1 6/2010 Trezza
2010/0148316 A1 6/2010 Kim et al.
2010/0187681 A1 7/2010 Chen et al.
2010/0197134 A1 8/2010 Trezza
2010/0230759 A1 9/2010 Yang et al.
2010/0230760 A1 9/2010 Hung
2010/0230788 A1 9/2010 Peng
2010/0244244 A1 9/2010 Yang
2010/0276690 A1 11/2010 Chen
2010/0308435 A1 12/2010 Nowak et al.
2010/0327465 A1 12/2010 Shen et al.
2011/0048788 A1 3/2011 Wang et al.
2011/0068437 A1 3/2011 Chiu et al.
2011/0079917 A1 4/2011 Xia et al.
2011/0084358 A1 4/2011 Kim et al.

FOREIGN PATENT DOCUMENTS

JP 2004228135 A 8/2004
TW 200612539 A 4/2006
TW 200926322 A 6/2009

* cited by examiner

SEMICONDUCTOR STRUCTURE WITH PASSIVE ELEMENT NETWORK AND MANUFACTURING METHOD THEREOF

CROSS-REFERENCE TO RELATED APPLICATIONS

This application claims the benefit of Taiwan application serial nos. 100101155, filed Jan. 12, 2011; 100100719 filed Jan. 7, 2011; and 100142771, filed Nov. 22, 2011, the subject matter of which is incorporated herein by reference.

BACKGROUND OF THE INVENTION

1. Field of the Invention

The present invention relates generally to the field of semiconductor packaging, and, more particularly, to 3D semiconductor packaging employing through silicon via (TSV) technology.

2. Description of the Related Art 3D packaging permits a plurality of chips to be arranged one on top of another, and to communicate with each other as if they were all one unified microchip. Interposers are often used to connect die to die, die to package substrate or package to package. Although conventional interposers are highly useful as bridges, they usually do not combine routing with more complicated features.

SUMMARY OF THE INVENTION

One aspect of the disclosure relates to a semiconductor structure. In one embodiment, the semiconductor structure includes a substrate including a conductive via formed therein; a first dielectric layer disposed on a surface of the substrate, the first dielectric layer having an opening extending from an upper surface of the first dielectric layer to the surface of the substrate; and a passive element network disposed adjacent to the first dielectric layer and electrically connected to the conductive via through the opening. The substrate can be an interposer substrate, and the passive element network will include one passive electronic components such as resistors, capacitors, and inductors. The passive element network includes a plurality of patterned dielectric and conductive layers forming one or more of the passive electronic components. In an embodiment, a first inductor, a second inductor, and a common resistor electrically are connected with the first inductor and the second inductor. The semiconductor structure may further include a first capacitor and a second capacitor, the first capacitor and the second capacitor electrically connected with the common resistor. In an embodiment, the opening in the first dielectric layer is a substantially straight hole. The semiconductor structure can include a redistribution layer disposed on the passive element network and electrically connected to the passive element network and the conductive via. The redistribution layer can include a plurality of patterned dielectric and conductive layers. The redistribution layer can include an inductor. In an embodiment, the semiconductor structure further includes a second dielectric layer disposed adjacent the passive network, the second dielectric layer including an opening, the passive element network electrically connected to the conductive via through the opening in the second dielectric layer and the opening in the first dielectric layer.

Another aspect of the disclosure relates to a semiconductor structure that includes a conductive via formed therein; and a passive element network disposed adjacent to the substrate and electrically connected to the conductive via; wherein the passive element network includes a resistor, disposed adjacent to the substrate, and having a first metal and two electrodes, the electrodes being disposed on the first metal; and an inductor, disposed adjacent to the substrate, and electrically connected to the resistor, a bottom surface of the inductor coplanar with a bottom surface of the resistor. The semiconductor structure further includes a connection pad, disposed adjacent to the first surface of the substrate, and electrically connected to the inductor; a first protection layer, covering the resistor and the inductor, and having at least one opening to expose the connection pad; and a first under bump metallurgy (UBM), disposed in the opening of the first protection layer so as to electrically connect the connection pad.

Another aspect of the disclosure relates to manufacturing methods. In one embodiment, a manufacturing method includes providing a substrate; forming a conductive via in the substrate; forming a dielectric layer in the substrate; forming a passive element network on the first dielectric layer; and forming a redistribution layer. The step of forming the passive element network involves forming a plurality of patterned dielectric and conductive layers on the dielectric layer comprising one or more passive electronic component. The passive network can include a first inductor, a second inductor, and a common resistor electrically connected with the first inductor and the second inductor

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
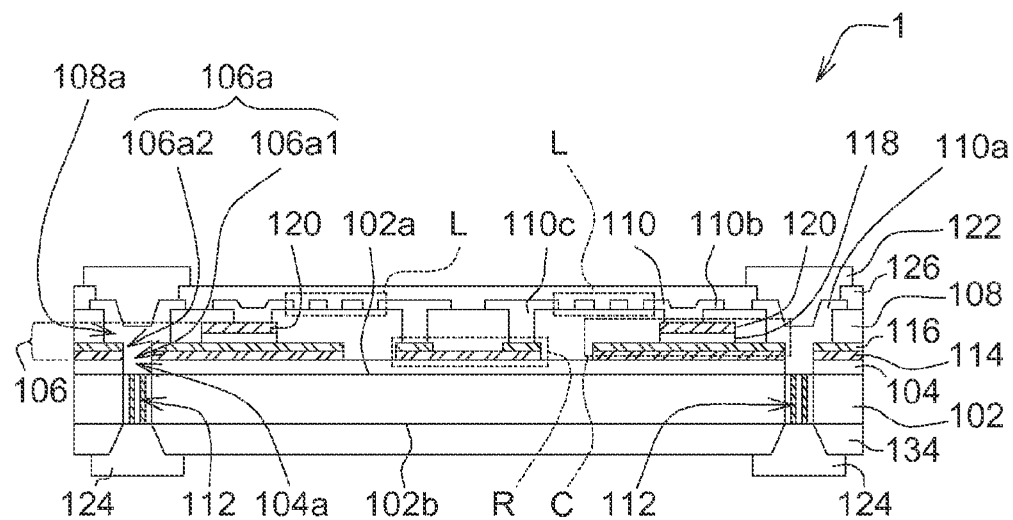
FIG. 1 illustrates a cross-sectional view of an semiconductor structure according to an embodiment of the invention.

Referring to FIG. 1, a cross-sectional view of a semiconductor structure 1, according to an embodiment of the invention, is illustrated. The semiconductor structure 1 includes a substrate 102, conductive vias 112 (which may be through-silicon-vias), a passive element network 106, and a redistribution layer (RDL) 110. The semiconductor structure 1 may include an active die, such as a die having an integrated circuit or a MEMS device. The semiconductor structure 1 may include a stand-alone integrated circuit, such as, for example, a wafer-level chip-scale package (WL-CSP) or may be incorporated into a semiconductor package having additional elements (not shown), such as a package substrate and encapsulant. Alternatively, the semiconductor structure 1 may be an inactive die having no active elements (such as logic or memory circuitry). In the embodiment illustrated in FIG. 1, the semiconductor structure 1 is an interposer.

The substrate 102, which may be a non-conductive material (such as glass) or a semiconductive material (such as silicon), has one or more of the conductive vias 112. Each of the conductive vias 112 extends from a first (upper) surface 102*a* of the substrate 102, through the substrate 102, to a second (lower) surface 102*b*. The conductive vias 112 may be plated with conductive material such as copper and may include an insulation layer disposed between the conductive material and the substrate 102.

A first dielectric layer 104 is disposed on a first surface 102*a* of the substrate 102. The first dielectric layer 104 has openings which align with and allow for electrical interconnection to the corresponding conductive vias 112. The first dielectric layer 104 may be made from a polymer material.

The passive element network 106 is disposed on the first dielectric layer 104. The passive element network 106 includes one or more metal layers 114, 116 and 120 and one or more dielectric/insulation layers 118, as illustrated in FIG. 1. Depending upon design considerations, the passive element network 106 can include a plurality of passive elements such as capacitors (C), inductors (L) and resistors (R), which may be interconnected or discrete elements, as shown more fully below in FIG. 2. These passive elements and others may be disposed in the passive element network 106, the RDL 110 or in other locations within the semiconductor structure 1. The passive element network 106 also has openings or regions void of passive elements, which may align with and correspond to the openings in the first dielectric to further facilitate electrical interconnections with the conductive vias 112.

The RDL 110 is a series of one or more dielectric/passivation layers and metal layers. As depicted in FIG. 1, a dielectric layer 108 is disposed over the passive element network 106. The dielectric layer 108 also has one or more openings which align with and correspond to the openings in the first dielectric layer 104 and the passive element network 106 to facilitate electrical interconnection with the conductive vias 112. Interconnects 110*a* are disposed in the various openings and are electrically connected to the conductive via 112. The RDL 110 also includes passive interconnects 110*b* and a metal trace 110*c*. The RDL serves to route or interconnect the passive element network 106 with the conductive via 112, other components within a semiconductor package or with components external to the semiconductor package. Signals are transmitted from the conductive via 112 to the second metal layer 116 through the interconnects 110*a*, and the second metal layer 116 is defined as the lower electrode of the capacitor C. The RDL 110 may also include a first dielectric protection layer 126 which is disposed over portions of the passive interconnects 110*b* and the metal trace 110*c*. The first dielectric protection layer 126 also has openings aligned with and corresponding to openings previously mentioned such that first electrical contacts 122 may be disposed in such openings and electrically connected to the interconnects 110*a*. The interconnects 110*a* may also have electrical connection with elements of the passive element network 106. As illustrated in FIG. 1, certain side and/or upper surfaces of the passive element network 106 are in direct and electrical connection with the interconnects 110*a*.

A second dielectric layer 134 is disposed on the lower surface 102*b* of the substrate 102. The second dielectric layer 134 also has openings aligned with and corresponding to the conductive vias 112 such that a contact 124 may electrically connect to the lower portion of the conductive via 112.

Figure 2:
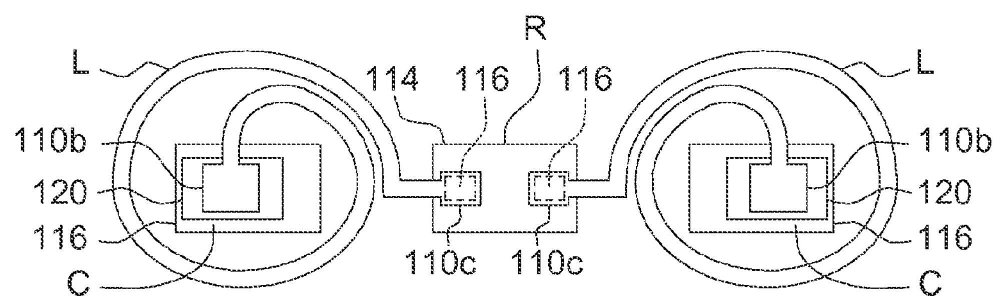
FIG. 2 illustrates a top view of a passive element network consistent with FIG. 1.

Referring to FIG. 2, a top view of the passive element network 106, including the inductor, capacitor and resistor structures of FIG. 1, is illustrated. The passive element network 106 includes the metal layers 114, 116 and 120, and a dielectric layer 118 (illustrated in FIG. 1). The various metal layers and dielectric layers are implemented so as to form capacitors C, inductors L and resistors R.

In FIG. 2, the metal layer 114 may be a high resistance material such as tantalum nitride (TaN), $PbTiO_3$, ruthenium dioxide ($RuO_2$), nickel phosphide (NiP), nickel chromium (NiCr), and combinations thereof. The metal layers 116 and 120 may be a material with superior conductivity such as copper or copper aluminum alloy. The dielectric layer 118 (illustrated in FIG. 1 for the capacitor) may be an insulator, such as tantalic oxide ($Ta_2O_5$). A separate tantalum (Ta) layer (not illustrated) may be disposed on the metal layer 114. The tantalum layer may be oxidized to form insulator tantalic oxide that may serve as a capacitor dielectric layer 118. To protect the metal layer 114 from electrostatic discharge (ESD), some portion of the metal layer 114 may be made from a material of good conductivity such as AlCu, instead of the high resistance material. Since ESD damage may occur at the extremities, corners or distal ends, corresponding portions of the metal layer 114 are made from a material having good conductivity and the other portions of the metal layer 114 are made from the high resistance material.

Figure 3:
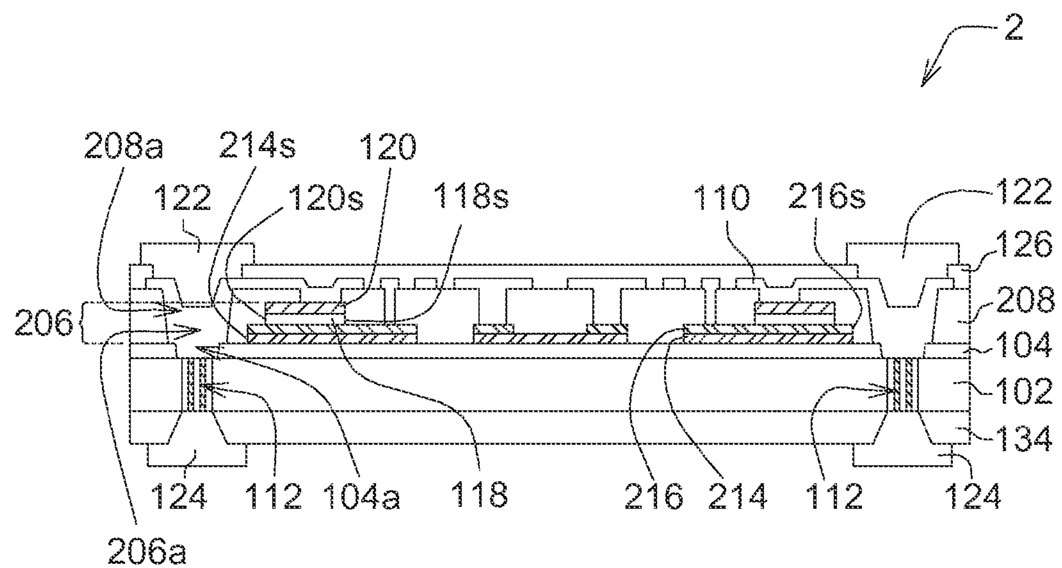
FIG. 3 illustrates a cross-sectional view of semiconductor structure according to an another embodiment of the invention.

Referring to FIG. 3, a cross-sectional view of a semiconductor structure 2, according to another embodiment of the invention, is illustrated. The semiconductor structure 2 includes the substrate 102, the first dielectric layer 104, the passive element network 206, and the redistribution layer (RDL) 110. The semiconductor structure 2 may be distinguished from the semiconductor structure 1 in that the RDL 110 and a lateral surface of the passive element network 206 are separated by a second dielectric layer 208. Furthermore, the RDL 110 does not contact the lateral surface of the passive element network 206. For example, the RDL 110 does not contact a lateral surface 214*s* of a first metal layer 214 or a lateral surface 216*s* of the second metal layer 216.

As shown in FIG. 3, the passive element network 206 includes the first metal layer 214, the second metal layer 216, the capacitor dielectric layer 118 and a third metal layer 120. The second dielectric layer 208 covers the lateral surface 214*s* of the first metal layer 214, the lateral surface 216*s* of the second metal layer 216, a lateral surface 120*s* of the third metal layer 120 and a lateral surface 118*s* of the capacitor dielectric layer 118, so that lateral surfaces of the first metal layer 214, the second metal layer 216, the third metal layer 120 and the capacitor dielectric layer 118 are not exposed from the third opening 208*a*. Signals are transmitted from the conductive via 112 to the third metal layer 120 through the interconnect 110*a*; the third metal layer 120 is the upper electrode of capacitor C. In other embodiments, the second dielectric layer 208 further covers a lateral surface of a first dielectric layer 104, so that a lateral surface 104*s* of the first dielectric layer 104 is not exposed from the third opening 208*a* of the second dielectric layer 208 or exposed from a first opening 104*a* of the first dielectric layer 104.

Referring to FIGS. 4A to 4L, a process of manufacturing the semiconductor structure 1 of FIG. 1 is illustrated.

Figure 4A:
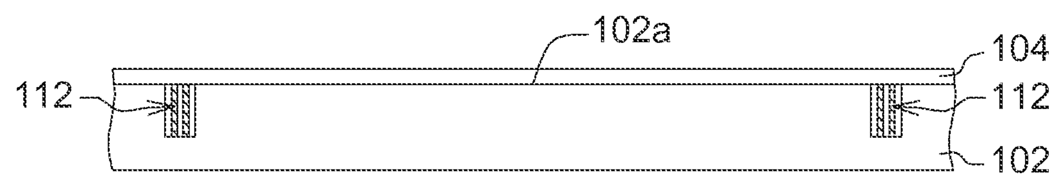
FIGS. 4A-4L illustrates the process of manufacturing the semiconductor structure of FIG. 1.

Referring to FIG. 4A, the substrate 102 is provided, wherein the substrate 102 has at least the conductive via 112. Then, the first dielectric layer 104 is disposed on the first surface 102*a* of the substrate 102 by way of coating, such as by printing, spinning or spraying, or by forming a negative photoresist layer.

Figure 4B:
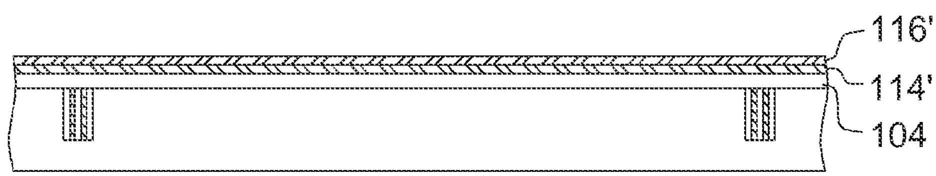

Referring to FIG. 4B, a first metal material 114' is formed on the first dielectric layer 104 by, for example, chemical vapor deposition, electroless plating, electrolytic plating, printing, spinning, spraying, sputtering or vacuum deposition. The material of the first metal material 114' is resistor material, so that the first metal material 114' can be used as a resistor layer for the subsequent resistor structure R. Then, a second metal material 116' is formed on the first metal material 114'. The second metal material 116' can be used as an electrode for the capacitor structure C and an electrode for the resistor structure R which are formed subsequently. The method for forming the second metal material 116' is similar to that of the first metal material 114', and the similarities are not repeated here.

Figure 4C:
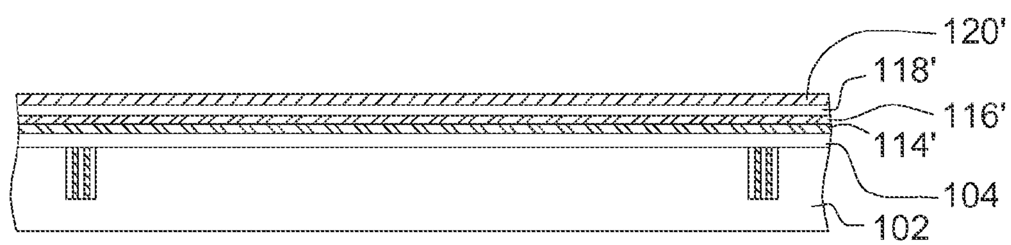

Referring to FIG. 4C, a capacitor dielectric material 118' is formed on the second metal material 116'. The capacitor dielectric material 118' may be realized by an oxidization layer. For example, a tantalum layer (not illustrated) can be formed on the second metal material 116' first. Then, the tantalum layer is oxidized by such as anode oxidization method, so as to form an oxidization layer on the tantalum layer, wherein the oxidization layer is also the capacitor dielectric material 118'. Then, a third metal material 120' is formed on the capacitor dielectric material 118'. The third metal material 120' may be used as an electrode material for the subsequent capacitor structure C.

Figure 4D:
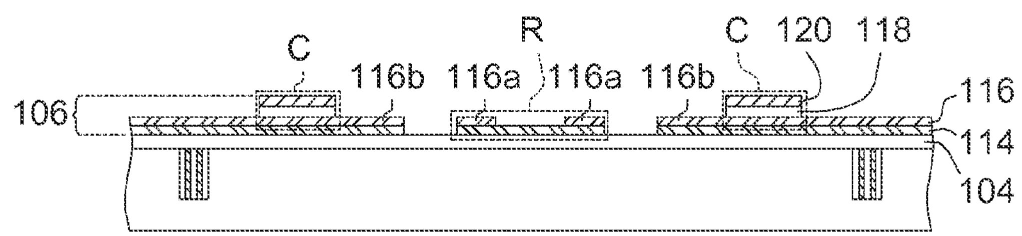

Referring to FIG. 4D, the first metal material 114' (illustrated in FIG. 4C), the second metal material 116' (illustrated in FIG. 4C), the capacitor dielectric material 118' (illustrated in FIG. 4C) and the third metal material 120' (illustrated in FIG. 4C) are patterned to respectively form the metal layer 114, the second metal layer 116, the capacitor dielectric layer 118 and the third metal layer 120. Examples of the above patterning method include photolithography, chemical etching, laser drilling and mechanical drilling. The metal layer 114 and the second metal layer 116 form at least a resistor structure R, while the second metal layer 116, the capacitor dielectric layer 118 and the third metal layer 120 form at least a capacitor structure C. Accordingly, the passive element network 106 is formed on the first dielectric layer 104.

Referring to FIG. 4D, the second metal layer 116 includes at least a resistor electrode 116*a* and at least a first capacitor electrode 116*b*. The resistor electrode 116*a* can be used as an electrode for the resistor structure R. The first capacitor electrode 116*b* is used as a lower electrode for the capacitor structure C. The third metal layer 120 can be used as an upper electrode for the capacitor structure C. The capacitor dielectric layer 118 is disposed between the first capacitor electrode 116*b* and the third metal layer 120.

Figure 4E:
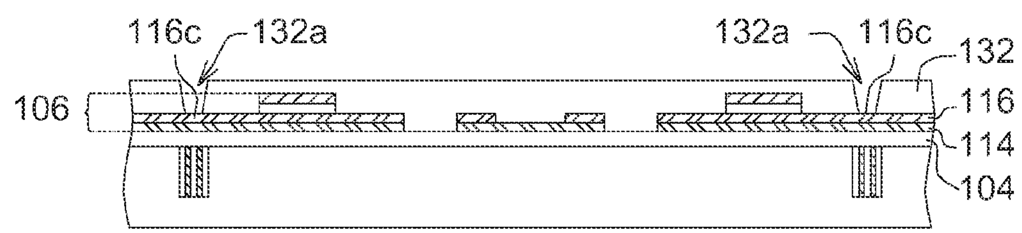

Referring to FIG. 4E, the patterned positive photoresist layer 132 is formed on the passive element network 106 above the first dielectric layer 104, wherein a portion of the patterned positive photoresist layer 132 is disposed on the first dielectric layer 104, the metal layer 114 and the second metal layer 116 which are above the conductive via 112. The patterned positive photoresist layer 132 has at least an aperture 132*a*, which exposes a portion 116*c* of the second metal layer 116 of the passive element network 106, wherein the portion 116*c* of the second metal layer 116 is disposed right above the conductive via 112.

Figure 4F:
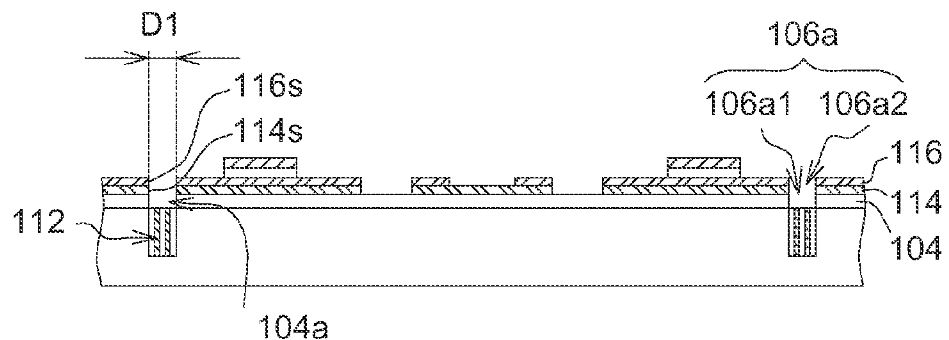

Referring to FIG. 4F, the patterned positive photoresist layer 132 (illustrated in FIG. 4E) is used as a mask, at least the first opening 104*a* is formed on the first dielectric layer 104 and at least a second opening 106*a* is formed on the passive element network 106, wherein, the first opening 104*a* exposes the conductive via 112, and the second opening 106*a* exposes the first opening 104*a*. For example, the first dielectric layer 104 and the passive element network 106 are respectively etched by an etching solution through the aperture 132*a* (illustrated in FIG. 4E) of the patterned positive photoresist layer 132 to form the first opening 104*a* and the second opening 106*a*, wherein, the first opening 104*a* and the second opening 106*a* can be formed under different or the same etching conditions.

In FIG. 4F, the patterned positive photoresist layer 132 (illustrated in FIG. 4E) may be used as a mask in one embodiment, and only the second opening 106*a* is formed on the passive element network 106, without forming the first opening 104*a*. The first opening 104*a* of the first dielectric layer 104 can be formed after a second dielectric layer 108 is formed (illustrated in FIG. 4G). For example, the first opening 104*a* and the third opening 108*a* of the second dielectric layer 108 (illustrated in FIG. 4G) can be formed at the same time. After the first opening 104*a* is formed, the conductive via 112 is exposed.

In FIG. 4F, the second opening 106*a* includes a first sub aperture 106*a*1 and a second sub aperture 106*a*2. The first sub-aperture 106*a*1 penetrates the metal layer 114 of the passive element network 106 and makes the metal layer 114 expose a lateral surface 114*s*. The second sub-aperture 106*a*2 penetrates the second metal layer 116 of the passive element network 106 and makes the second metal layer 116 expose a lateral surface 116*s*. The first sub-aperture 106*a*1 and the second sub-aperture 106*a*2 can be formed under different or the same etching conditions.

In FIG. 4F, the second opening 106*a* is formed before the formation of the first opening 104*a*, so that the first dielectric layer 104 is exposed from the first opening 104*a*. The metal layer (the metal layer 114 and the second metal layer 116) of the passive element network 106 and the second opening 106*a* forms a metal mask. Due to the properties of the metal mask, after the first opening 104*a* is formed, the first opening 104*a* will be a straight hole or a hole with small taper and a small aperture. For example, the smallest inner diameter D1 of the first opening 104*a* is about 10 micrometers (μm). Furthermore, the metal mask restricts the amount of reaming of the first opening 104*a*, and the dimension of the first opening 104*a* can thus be precisely controlled. Thus, the wider the first openings 104*a* can be formed, the quantity of the I/O contact can be increased and the dimension of the semiconductor structure can be reduced.

In FIG. 4F, after the first opening 104*a* is formed under a wet etching process, the smallest inner diameter D1 of the first opening 104*a* is small, due to the properties of the positive photoresist of the patterned positive photoresist layer 132. Furthermore, the patterned positive photoresist layer 132 restricts the amount of reaming of the first opening 104*a*, and the dimension of the first opening 104*a* can thus be precisely controlled. Thus, more of the first openings 104*a* can be formed, the quantity of I/O contacts can be increased and the dimension of the semiconductor structure can be reduced. Then, the patterned positive photoresist layer 132 is removed, the resulting structure illustrated in FIG. 4F.

Figure 4G:
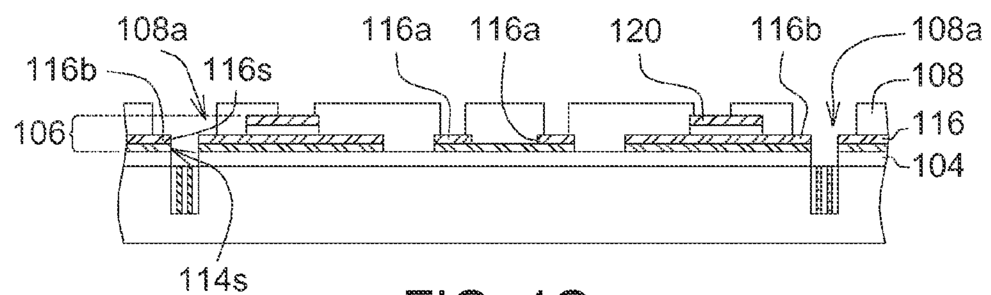

Referring to FIG. 4G, the second dielectric layer 108 covers at least one of the metal layer 114, the second metal layer 116, the third metal layer 120 and the capacitor dielectric layer 118 of the passive element network 106, wherein the second dielectric layer 108 does not cover the lateral surface 114*s* of the metal layer 114 or the lateral surface 116*s* of the second metal layer 116. That is, the second dielectric layer 108 exposes the lateral surface 114*s* of the metal layer 114 and the lateral surface 116*s* of the second metal layer 116. The second dielectric layer 108 has at least a third opening 108*a*, which exposes the first capacitor electrode 116*b*.

In FIG. 4G, the formation of the second dielectric layer 108 is similar to that of the first dielectric layer 104, and the similarities are not repeated here. The material of the second dielectric layer 108 can be similar to that of the first dielectric layer 104, and the similarities are not repeated here. The first electrode aperture 108*b* of the second dielectric layer 108 exposes its corresponding third metal layer 120, while the second electrode aperture 108*c* of the second dielectric layer 108 exposes its corresponding resistor electrode 116*a* of the second metal layer 116.

Figure 4H:
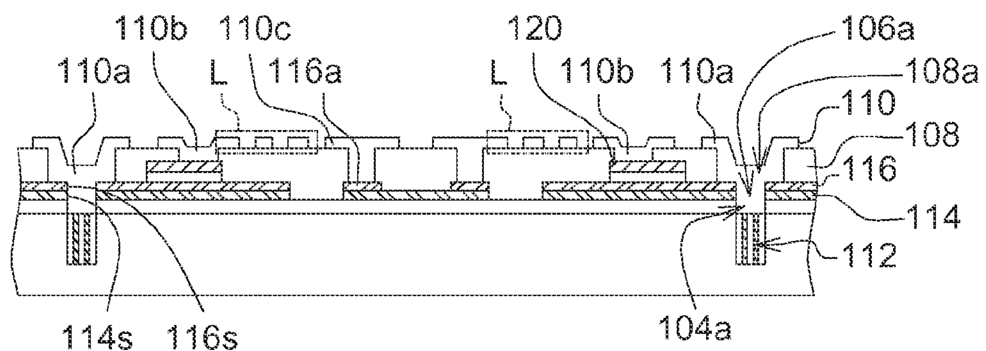

Referring to FIG. 4H, the RDL 110 is formed on the second dielectric layer 108, wherein, the RDL 110 is electrically connected to the conductive via 112 through the third opening 108*a* of the second dielectric layer 108, the second opening 106*a* of the passive element network 106 and the first opening 104*a* of the first dielectric layer 104. Furthermore, the RDL 110 can have an inductor structure L. However, in other embodiments, the inductor structure L is not formed in the RDL layer 110.

Referring to FIG. 4H, the RDL 110 includes the interconnect 110*a*, the passive interconnect 110*b* and the metal trace 110*c*. The interconnect 110*a* of the re-distribution layer 110 covers the lateral surface 114*s* of the metal layer 114 and the lateral surface 116*s* of the second metal layer 116 of the passive element network 106 through the third opening 108*a* of the second dielectric layer 108 and the second opening 106*a* of the passive element network 106, and further electrically contacts the conductive via 112 through the first opening 104*a* of the first dielectric layer 104. The passive interconnect 110*b* of the RDL 110 electrically contacts the third metal layer 120 of the passive element network 106 through the first electrode aperture 108*b* of the second dielectric layer 108. The metal trace 110*c* of the RDL 110 electrically contacts the second metal layer 116 of the passive element network 106 through the second electrode aperture 108*c* of the second dielectric layer 108.

Figure 4I:
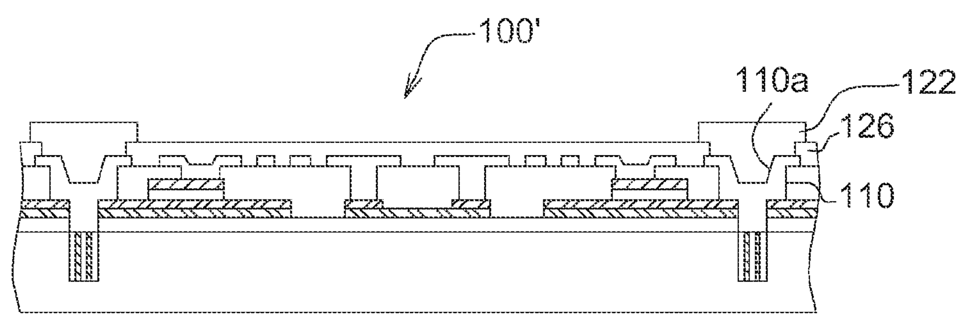

Referring to FIG. 4I, the first dielectric protection layer 126 is formed on the RDL 110 using photolithography, such that the first dielectric protection layer 126 has at least a fourth opening 126*a*, which exposes the corresponding interconnect 110*a* of the RDL 110.

In FIG. 4I, the first electrical contact 122 is formed on the interconnect 110*a* of the RDL 110 using an electroplating process, for example, so that the first electrical contact 122 electrically contacts the RDL 110. Here, the semiconductor structure 2, which has a passive element network 106 and can be electrically connected to the exterior, is formed. In another embodiment, electrical contacts can further be formed on a second surface 102*b* (illustrated in FIG. 4J) of the substrate 102 through the following steps.

Figure 4J:
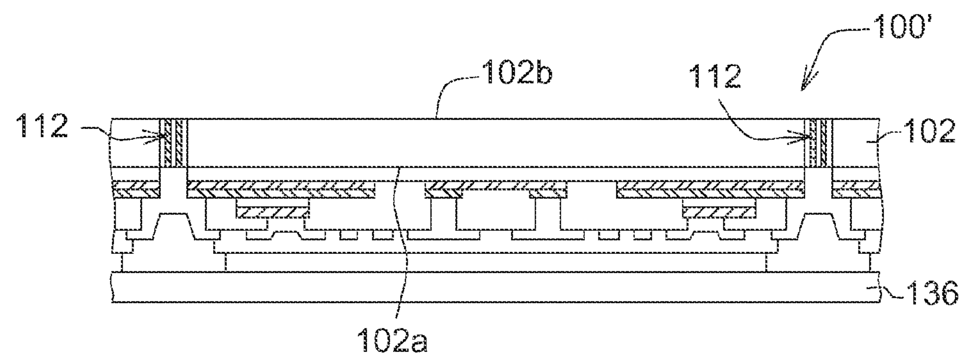

Referring to FIG. 4J, the semiconductor structure 1' of FIG. 4J can be inverted so that the substrate 102 faces upwards and is disposed on an adhesive layer (not illustrated) of a carrier 136. Using a grinding process, the thickness of the substrate 102 can be reduced, so as to expose the second surface 102*b* of the substrate 102, as illustrated in FIG. 4J, such that the conductive via 112 is extended to the second surface 102*b* from the first surface 102*a*. In an embodiment, the grinding step can be omitted as long the conductive via 112 of the substrate 102 extends to the second surface 102*b* from the first surface 102*a* in the step of providing the substrate 102.

Figure 4K:
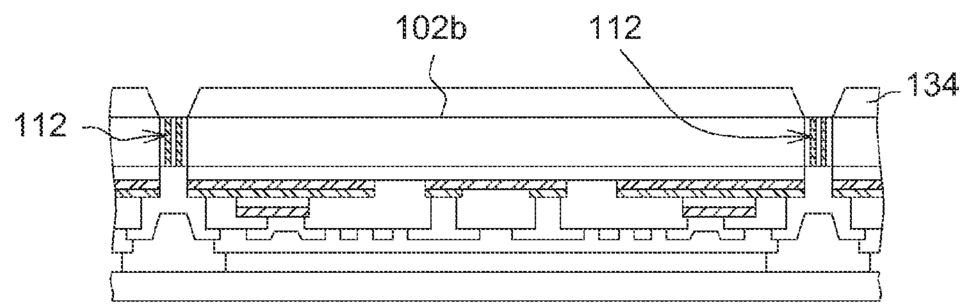

Referring to FIG. 4K, the second dielectric layer 134 is formed on the second surface 102*b* of the substrate 102. The formation of the second dielectric layer 134 is similar to that of the first dielectric protection layer 126, and the similarities are not repeated here. At least a fifth aperture 134*a* is formed on the second dielectric layer 134, such that the fifth aperture 134*a* exposes its corresponding conductive via 112.

Figure 4L:
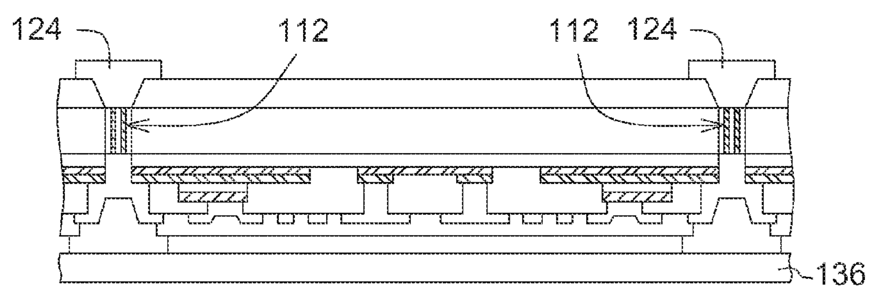

Referring to FIG. 4L, at least a second electrical contact 124 is formed in the corresponding fifth aperture 134*a* by way electroplating, for example, so that the second electrical contact 124 is electrically connected to the conductive via 112. Then, the carrier 136 of FIG. 4L is removed. The formation of the semiconductor structure 1 thus is completed.

Referring to FIG. 5A-5E, the manufacturing method of the semiconductor structure 2 is illustrated. The step of providing the substrate 102 (as indicated in FIG. 4A) to the step of forming the third metal material (as indicated in FIG. 4C) of the manufacturing method of semiconductor structure 2 are similar to the manufacturing method of the semiconductor structure 1, and the similarities are not repeated here.

Figure 5A:
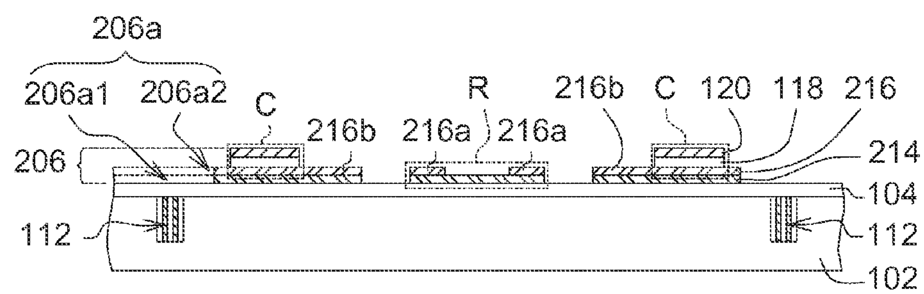
FIGS. 5A-5E illustrates the process of manufacturing the semiconductor structure of FIG. 3.

Referring to FIG. 5A, the first metal material 114' (illustrated in FIG. 4C), a second metal material 116' (illustrated in FIG. 4C), a capacitor dielectric material 118' (illustrated in FIG. 4C) and a third metal material 120' (illustrated in FIG. 4C) are respectively patterned to form the first metal layer 214, a second metal layer 216, the capacitor dielectric layer 118 and a third metal layer 120. Thus, the passive element network 206 is formed. The passive element network 206 has a second opening 206*a*, which comprises a first sub aperture 206*a*1 and a second sub aperture 206*a*2. The first metal layer 214 has a first sub aperture 206*a*1, and the second metal layer 216 has a second sub aperture 206*a*2, wherein the position of the first sub aperture 206*a*1 and that of the second sub aperture 206*a*2 are overlapped and correspond to the conductive via 112 for exposing the first dielectric layer 104 disposed above the conductive via 112. The first metal layer 214 and the second metal layer 216 forms at least a resistor structure R, while the second metal layer 216, the capacitor dielectric layer 118 and the third metal layer 120 form at least a capacitor structure C.

In FIG. 5A, the second metal layer 216 includes at least a resistor electrode 216*a* and at least a first capacitor electrode 216*b*. The resistor electrode 216*a* can be used as an electrode for the resistor structure R. The first capacitor electrode 216*b* can be used as a lower electrode for the capacitor structure C. The third metal layer 120 can be used as an upper electrode for the capacitor structure C. The capacitor dielectric layer 118 is interposed between the first capacitor electrode 216*b* and the third metal layer 120.

Figure 5B:
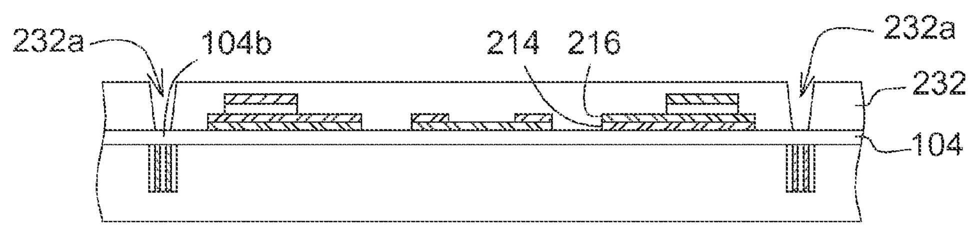

Referring to FIG. 5B, the patterned positive photoresist layer 232 is formed adjacent to the first dielectric layer 104. For example, the patterned positive photoresist layer 232 is formed for covering the first dielectric layer 104 and the passive element network 206, wherein a portion of the patterned positive photoresist layer 232 is disposed on the first dielectric layer 104 above the conductive via 112. The patterned positive photoresist layer 232 exposes a portion of the first dielectric layer 104. For example, the patterned positive photoresist layer 232 has at least an aperture 232*a*, which exposes a portion 104*b* of the first dielectric layer 104, wherein the portion 104*b* of the first dielectric layer 104 is located right above the conductive via 112.

Figure 5C:
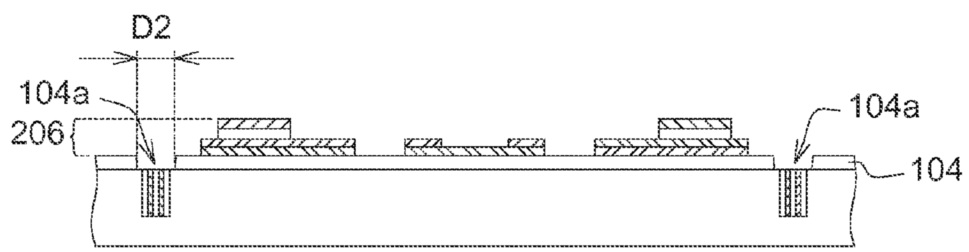

Referring to FIG. 5C, the patterned positive photoresist layer 232 is used as a mask, and at least the first opening 104*a* is formed on the first dielectric layer 104, wherein, the first opening 104*a* exposes its corresponding conductive via 112. For example, the first dielectric layer 104 is etched by etching solution through the aperture 232*a* (illustrated in FIG. 5B) of the patterned positive photoresist layer 232 to form the first opening 104*a*. Due to the properties of the positive photoresist of the patterned positive photoresist layer 232, after the first opening 104*a* is formed under a wet etching process, the smallest inner diameter D2 of the first opening 104*a* is controlled to be smaller than 10 μm. Furthermore, the patterned positive photoresist layer 232 restricts the amount of reaming of the first opening 104*a*, and the dimension of the first opening 104*a* can thus be precisely controlled. Then, the patterned positive photoresist layer 232 is removed, and the structure after removal is illustrated in FIG. 5C.

Figure 5D:
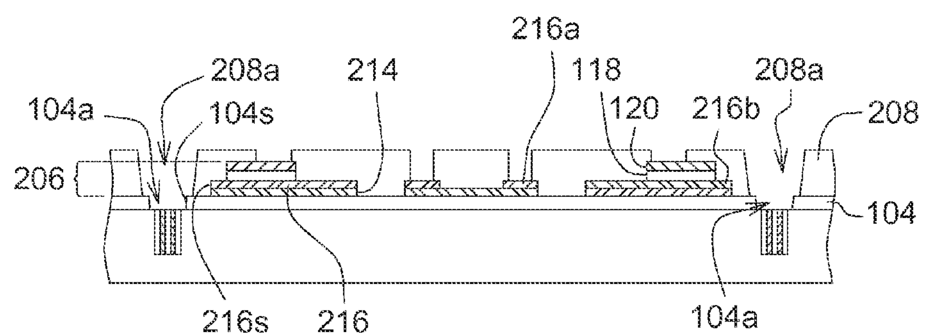

Referring to FIG. 5D, a second dielectric layer 208 is formed for covering at least one of the first metal layer 214, the second metal layer 216, the third metal layer 120 and the capacitor dielectric layer 118 of the passive element network 206. The second dielectric layer 208 further has at least a third opening 208*a*, which exposes the corresponding first opening 104*a* of the first dielectric layer 104. The formation of the second dielectric layer 208 is similar to that of the first dielectric layer 104, and the similarities are not repeated here. The first electrode aperture 108*b* of the second dielectric layer 208 exposes its corresponding third metal layer 120. The second electrode aperture 108*c* of the second dielectric layer 208 exposes its corresponding resistor electrode 216*s* of the second metal layer 216. In an embodiment, the second dielectric layer 208 can further encapsulate the lateral surface 104*s* of the first dielectric layer 104 and makes the lateral surface 104*s* of the first dielectric layer 104 not exposed from the third opening 208*a* or the first opening 104*a*.

Figure 5E:
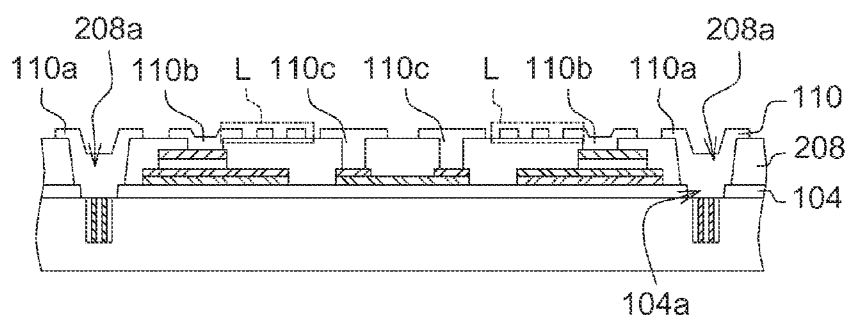

Referring to FIG. 5E, an RDL 110 is formed on the passive element network 206, such that the RDL 110 is electrically connected to the conductive via 112 through the third opening 208*a* of the second dielectric layer 208 and the first opening 104*a* of the first dielectric layer 104. Furthermore, the RDL 110 can have an inductor structure L. The RDL 110 includes the interconnect 110*a*, the passive interconnects 110*b* and the metal trace 110*c*. The first interconnect 110*a* of the RDL 110 electrically contacts the conductive via 112 through the third opening 208*a* of the second dielectric layer 208 and the first opening 104*a* of the first dielectric layer 104. The passive interconnect 110*b* of the RDL layer 110 electrically contacts the third metal layer 120 of the passive element network 206 through the first electrode aperture 108*b* of the second dielectric layer 208. The metal trace 110*c* of the RDL 110 the electrically contacts the second metal layer 216 of the passive element network 206 through the second electrode aperture 108*c* of the second dielectric layer 208. The subsequent steps of manufacturing the semiconductor structure 2 are similar to that of manufacturing the semiconductor structure 1, and the similarities are not repeated here.

Figure 6:
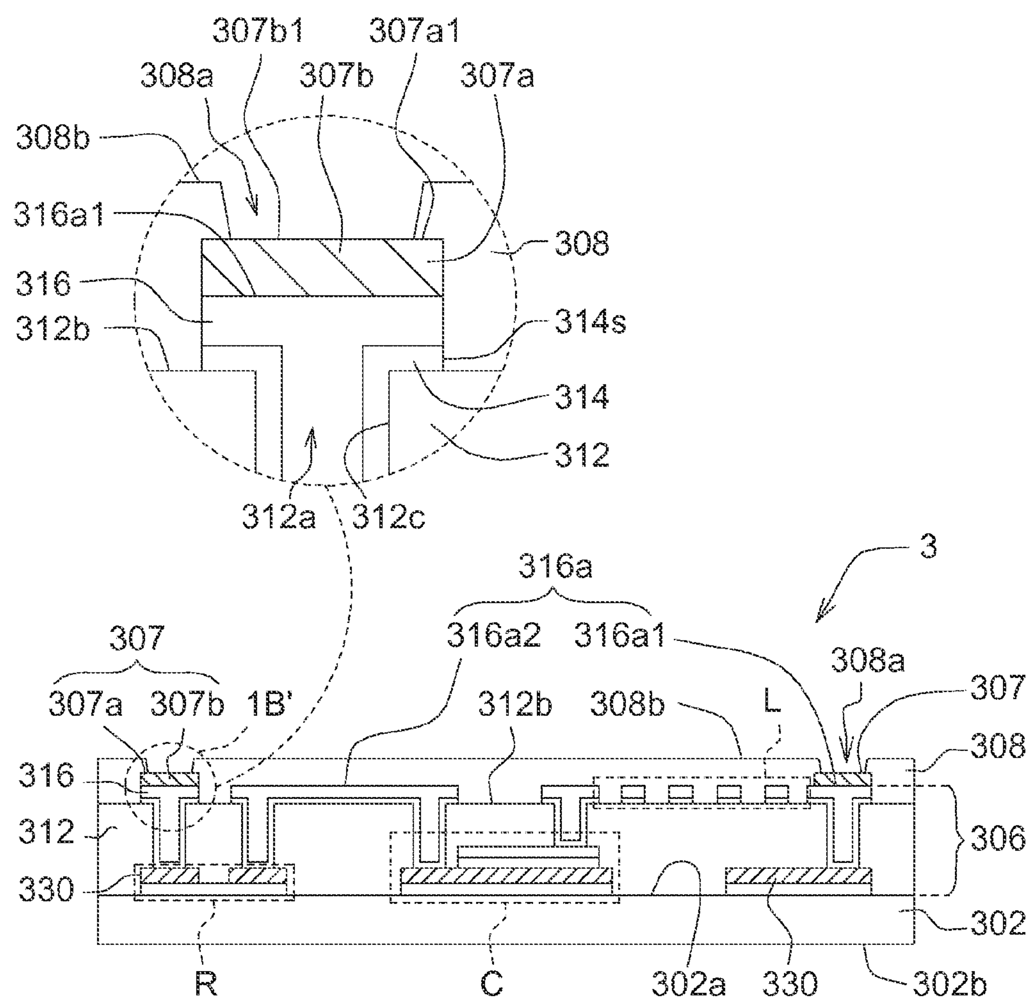
FIG. 6 illustrates a cross-sectional view of a semiconductor structure according to another embodiment of the invention.

Referring to FIG. 6, a cross-sectional view of a semiconductor structure 3, according to an embodiment of the invention, is illustrated. The semiconductor structure 3 includes a substrate 302, a passive element network 306, a first electrical contact 307 and a first dielectric layer 308.

The substrate 302 has a first surface 302*a* and a second surface 302*b* opposite to the first surface 302*a*. The substrate 302 can be realized by such as a glass substrate, a ceramic substrate, or other substrates with insulation property. Because of the insulation property of the substrate 302, the passive element network 306 can be directly formed on the substrate 302 so that the costs and complexity of the manufacturing process are reduced and the conformity rate is increased.

The passive element network 306 is formed on the first surface 302*a* of the substrate 302. The passive element network 306 comprises at least one of a resistor structure, an inductor structure and a capacitor structure. The passive element network 306 comprises a first trace layer 310, a second dielectric layer 312, a second seed layer 314 and a second trace layer 316. The first trace layer 310 forms at least a resistor structure R and at least a capacitor structure C, while the second trace layer 316 forms at least an inductor structure L. In greater detail, the first trace layer 310 is formed on the first surface 302*a* of the insulator substrate 302, and the second dielectric layer 312 covers the first trace layer 310. The second dielectric layer 312 has at least a second through hole 312*a*, a first surface 312*b* and a second inner lateral wall 312*c*. The second through hole 312*a* is extended to the first trace layer 310 from the first surface 312*b*, the second inner lateral wall 312*c* corresponds to the second through hole 312*a*, and a portion of the first trace layer 310 is exposed from the second through hole 312*a*. The second seed layer 314 is formed between the second trace layer 316 and the second dielectric layer 312. The second seed layer 314 has a lateral surface 314*s*, and is completely covered by the second trace layer 316 except the lateral surface 314*s*.

The first electrical contact 307 is formed on the passive element network 306. The first electrical contact 307 can be realized by a single-layered structure or a multi-layered structure, and the materials of the first electrical contact 307 at least comprise immersion Sn immersion Ag, chemistry nickel gold (ENIG), plated copper, plated iron, plated nickel or organic solder film (OSP). Alternatively, the first electrical contact 306 can be formed using copper (Cu), nickel (Ni), palladium (Pd) or gold (Au). The first electrical contact 307 can also be realized by an under bump metallization (UBM).

In FIG. 6, the first electrical contact 307 is formed on the second trace layer 316 of the passive element network 306. The first electrical contact 307 can be used as an electrode through which the passive element network 306 is electrically connected to the exterior. The first electrical contact 307 only covers a portion of the second trace layer 316. That is, the second trace layer 316 has an exposed surface such as the exposed top surface 316*a*. The first electrical contact 307 only covers a portion 316*a*1 of the exposed top surface 316*a* of the second trace layer 316, but exposes another portion of 316*a*2 of the exposed top surface 316*a* which is not covered by the first electrical contact 307. In an embodiment, the first electrical contact 307 can cover the totality of the second trace layer 316, and detailed descriptions are given below.

The first dielectric layer 308 covers the portion 307*a* of the first electrical contact 307, such as a top surface 307*a*1 of the portion 307*a* of the first electrical contact 307, while another portion of 307*b* of the first electrical contact 307 is exposed. The first dielectric layer 308 presses the portion 307*a* of the first electrical contact 307, so that the first electrical contact 307 is more tightly formed on the passive element network 306. The first dielectric layer 308 has at least a first aperture 308*a* from which another portion 307*b* of the first electrical contact 307 is exposed from. Furthermore, the first electrical contact 307 does not protrude from a top surface 308*b* of the first dielectric layer 308 but from the first aperture 308*a*, so that the top surface 308*b* of the first dielectric layer 308 is separated from a top surface 307*b*1 of the another portion of 307*b* of the first electrical contact 307 by a distance.

Figure 7:
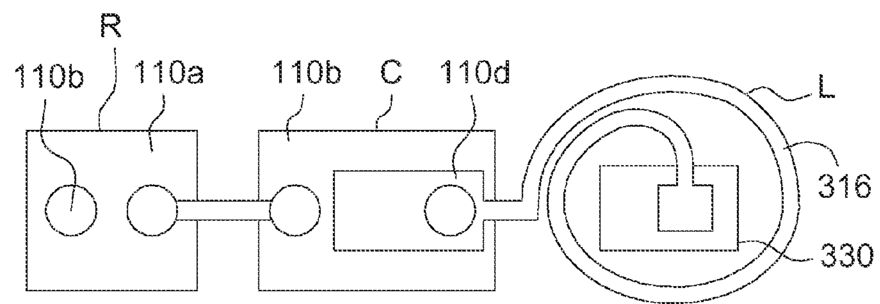
FIG. 7 illustrates a top view of the passive element network consistent with FIG. 6.
Figure 10A:
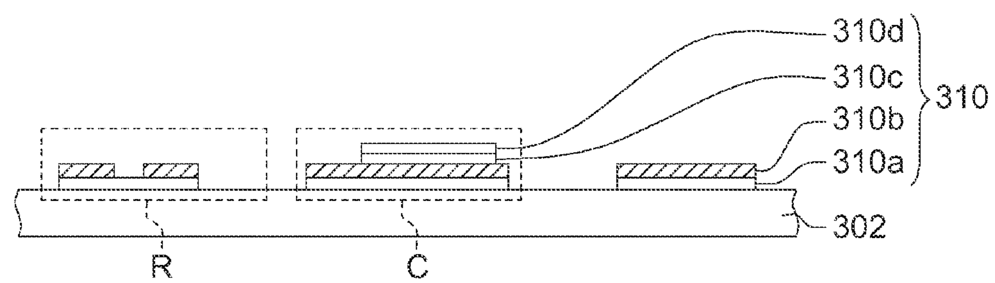
FIGS. 10A-10G illustrate a manufacturing process of the structure of FIG. 6.

Referring to FIG. 7, a top view of the resistor R, capacitor C and inductor structure L of FIG. 6 is illustrated. The interconnect 110*a*, the passive interconnect 110*b* and a third conductive layer 110*d* of FIG. 2 are explained in subsequent descriptions (FIG. 10A).

Figure 8:
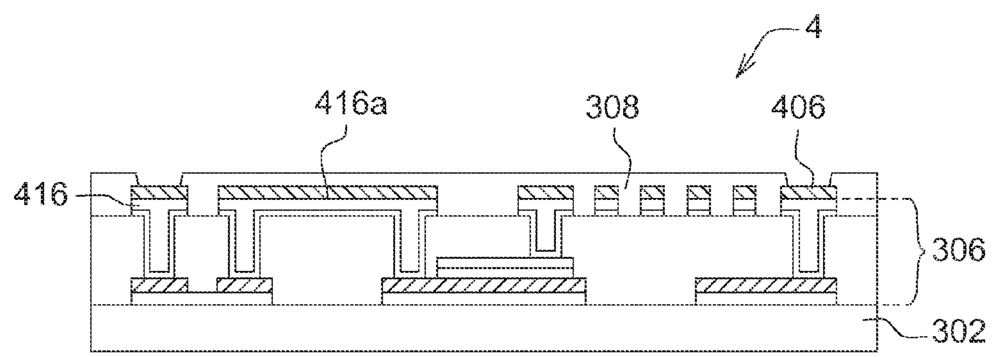
FIG. 8 illustrates a cross-sectional view of a semiconductor structure according to another embodiment of the invention.

Referring to FIG. 8, a cross-sectional view of a semiconductor structure 4, according to another embodiment of the invention, is illustrated. The semiconductor structure 4 comprises a substrate 302 which is made from an insulative material, a passive element network 306, a first electrical contact 407 and the first dielectric layer 308. The first electrical contact 407 of the semiconductor structure 400 completely covers the entire of an exposed top surface 416*a* of second trace layer 416. The materials of the first electrical contact 407 are similar to that of the first electrical contact 307, and the similarities are not repeated here. In the semiconductor structure 4, the first dielectric layer 308 presses a portion of the first electrical contact 407, and such characteristics being similar to the semiconductor structure 3 in which the first dielectric layer 308 presses the first electrical contact 307 are not repeated here. The semiconductor structures 3 and 4 are structures having an electrical contact on one single side. In another embodiment, the semiconductor structure can have electrical contacts on multiple sides.

Figure 9A:
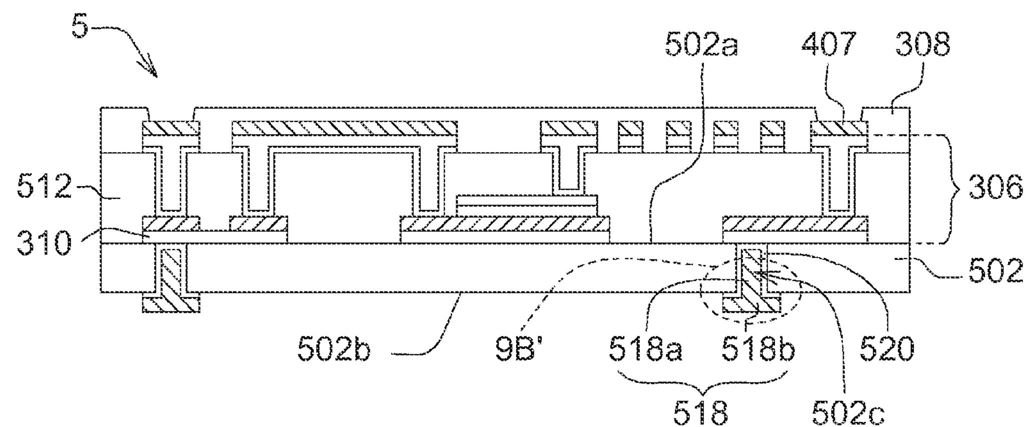
FIG. 9A illustrates a cross-sectional view of a semiconductor structure according to another embodiment of the invention.

Referring to FIG. 9A, a cross-sectional view of a semiconductor structure 5, according to another embodiment of the invention, is illustrated. The semiconductor structure 5 comprises a substrate 502 which is made from an insulative material, a passive element network 306, a first electrical contact 407, the first dielectric layer 308, a second electrical contact 518 and a first seed layer 520.

In FIG. 9A, the first electrical contact 407 and the second electrical contact 518 are disposed on opposite sides of the semiconductor structure 5. The substrate 502 has a first surface 502*a* and a second surface 502*b* opposite to the first surface 502*a*. The passive element network 306 is formed on the first surface 502*a*. The first electrical contact 407 formed on the passive element network 306 electrically contacts the passive element network 306 and become an electrical contact on one side of the semiconductor structure 5. The substrate 502 has at least a first through hole 502*c*. The second electrical contact 518 formed in the first through hole 502*c* electrically contacts the passive element network 306 and becomes an electrical contact on an opposite surface of the semiconductor structure 5.

In FIG. 9A, a portion 518*a* of the second electrical contact 518 is located in the first through hole 502*c*, and another portion 518*b* of the second electrical contact 518 is formed adjacent to the second surface 502*b* of the insulator substrate 502 such as formed on the first seed layer 520 adjacent to the second surface 502*b*, so that the another portion 518*b* of the second electrical contact 518 is protruded from the second surface 502*b* to electrically contact external electrical elements.

In FIG. 9A, the first trace layer 310 covers at least a portion of the first seed layer 520 That is, the first seed layer 520 is completely covered by the second electrical contact 318 except a lateral surface 520*s* of the first seed layer 520.

Figure 9B:
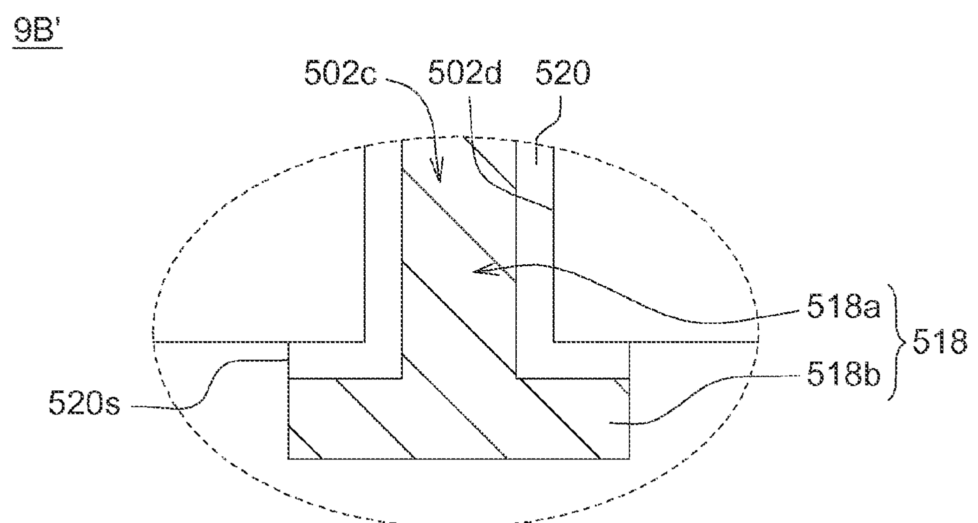
FIG. 9B illustrates an enlargement of the portion 9B' of FIG. 9A.

Referring to FIG. 9B, an enlargement of the portion 9B' of FIG. 9A is illustrated. The substrate 502 further has a first inner lateral wall 502*d* corresponding to the first through hole 502*c*. The first seed layer 520 is formed between the first inner lateral wall 502*d* of the substrate 502 and the second electrical contact 518.

Referring to FIGS. 10A~10G, a manufacturing process of the semiconductor structure 3 is illustrated.

Referring to FIG. 10A, firstly, a substrate 302 which is made from an insulative material is provided. Next, a passive element network 306 is formed on the first surface 302*a* of the substrate 302. As illustrated in FIG. 10A, the first trace layer 310 is formed on the first surface 302*a* of the substrate 302, wherein, the first trace layer 310 has at least a resistor structure R and at least a capacitor structure C. The first trace layer 310 can be formed by any of the conductive material forming methods, such as chemical vapor deposition, electroless plating, electrolytic plating, printing, spinning, spraying, sputtering or vacuum deposition first, and then the first trace layer 310 is formed by the patterning technology such as photolithography, chemical etching, laser drilling, or mechanical drilling.

In FIG. 10A, the first trace layer 310 includes a first conductive layer 310*a*, a second conductive layer 310*b*, a capacitor dielectric layer 310*c* and the third conductive layer 310*d*. The first conductive layer 310*a* is formed on the first surface 302*a* of the substrate 302, the second conductive layer 310*b* is formed on the first conductive layer 310*a*, and the capacitor dielectric layer 310*c* is located between the second conductive layer 310*b* and the third conductive layer 310*d*. The first conductive layer 310*a*, which can be used as a resistor structure, is made from a high resistance material such as tantalum nitride (TaN), $PbTiO_3$, ruthenium dioxide ($RuO_2$), nickel phosphide (NiP), nickel chromium (NiCr) and NCAlSi. The second conductive layer 310*b* and the third conductive layer 310*d* are made from conductive material such as at least one of aluminum (Al) and copper (Cu).

Figure 10B:
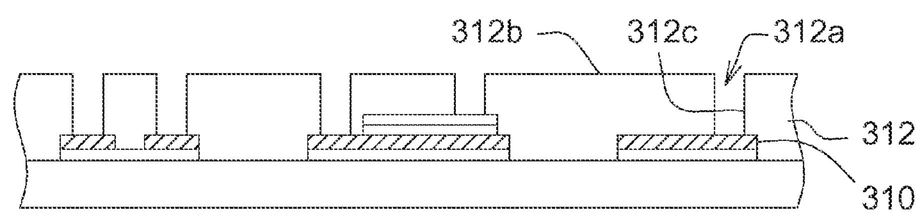

Referring to FIG. 10B, a second dielectric layer 312 is formed to cover the first trace layer 310. The second dielectric layer 312 has at least a second through hole 312*a*, a first surface 312*b* and a second inner lateral wall 312*c*. The second through hole 312*a* is extended to the first trace layer 310 from the first surface 312*b*. The second inner lateral wall 312*c* corresponds to the second through hole 312*a*. A portion of the first trace layer 310 is exposed from the second through hole 312*a*, wherein the exposed portion of the first trace layer 310 is such as the electrical contact or positive/negative electrode of at least one of the resistor structure R and the capacitor structure C. The second dielectric layer 312 is made from polyimide (PI). The second dielectric layer 312 can be formed by the a suitable coating technology, such as printing, spinning, or spraying.

Figure 10C:
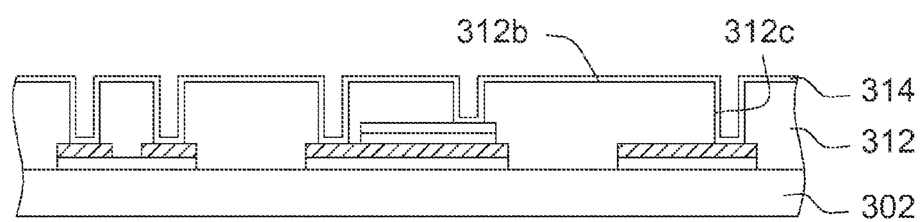

Referring to FIG. 10C, a second seed layer 314 is formed by electroless plating or sputtering to cover the second inner lateral wall 312*c* and the first surface 312*b* of the second dielectric layer 312. For example, the second seed layer 314 covers the totality of the second inner lateral wall 312*c* and the totality of the first surface 312*b*.

Figure 10D:
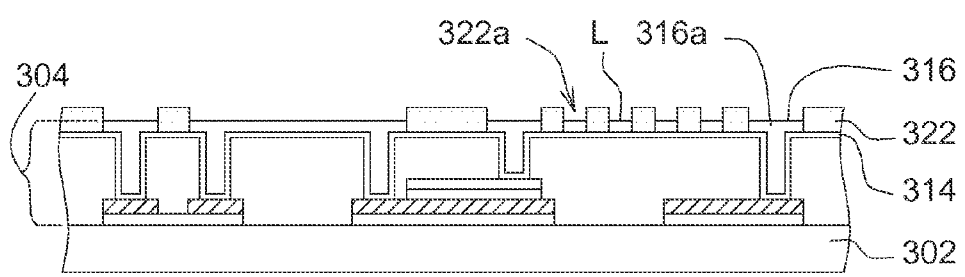

Referring to FIG. 10D, a second trace layer 316 is formed on the second seed layer 314 through the electrical connection between the second seed layer 314 and the electrode (not illustrated) of the electroplating facility. The second trace layer 316 has an inductor structure L. Thus, the passive element network 306 is formed. The second trace layer 316 can be made from a suitable metal such as copper.

In FIG. 10D, prior to the formation of the second trace layer 316, a patterned photoresist layer 322 such as a positive photoresist can be formed on the second seed layer 314. The patterned photoresist layer 322 defines a formation region 322*a* (the hollowed region on the patterned photoresist layer 322 of FIG. 10D) of the second trace layer 316. Afterwards, the second trace layer 316 is formed in the formation region 322*a* by electroplating. The exposed top surface 316*a* is the surface of the second trace layer 316 exposed from the formation region 322*a*. The patterned photoresist layer 322 can be formed by forming a photoresist material (not illustrated) using the material forming method or the coating method first, and then patterning the photoresist material. After the second trace layer 316 is formed, the patterned photoresist layer 322 is removed by such as stripping or etching technology.

Figure 10E:
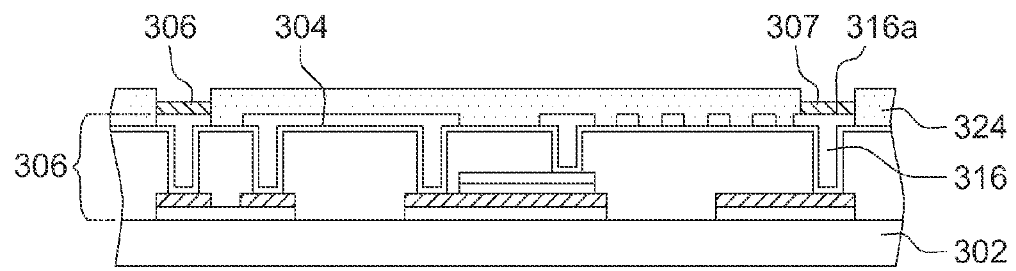

Referring to FIG. 10E, at least a first electrical contact 307 is formed on the passive element network 306, wherein, the formation of the first electrical contact 307 is achieved by forming the first electrical contact 307 on the second trace layer 316 using the second seed layer 314 by such as electroplating technology. Furthermore, the first electrical contact 307 in FIG. 10E is formed through the electrical connection between the second seed layer 314 and the electroplating facility that is formed in the previous step, so that the processing time and manufacturing costs are both reduced and manufacturing efficiency is increased.

In FIG. 10E, prior to the formation of the first electrical contact 307, a patterned photoresist layer 324 is formed on the second seed layer 314 in a manner similar to the formation of the patterned photoresist layer 322 (illustrated in FIG. 10D). The patterned photoresist layer 324, such as a positive photoresist, defines a formation region of the first electrical contact 307. Afterwards, at least a first electrical contact 307 is formed in the formation region by such as electroplating technology or sputtering technology. Following the formation the first electrical contact 307, the patterned photoresist layer 324 is removed by such as stripping or etching technology. The first electrical contact 307 is formed on a portion of the second trace layer 316 such as the exposed top surface 316*a* of the second trace layer 316.

Figure 10F:
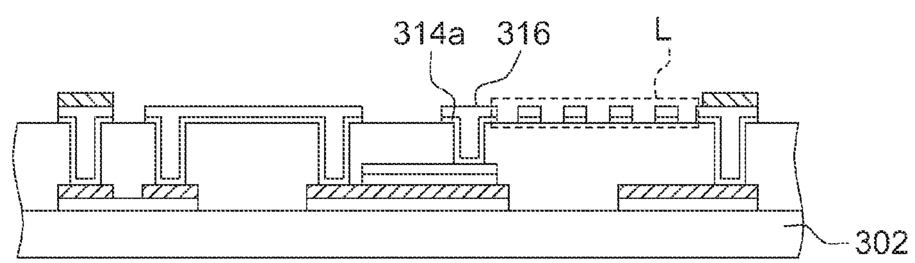

Referring to FIG. 10F, a portion of the second seed layer 314 is removed by such as etching technology, but another portion of 314*a* of the second seed layer 314 is maintained. The removed portion of the second seed layer 314 is the portion not covered by the second trace layer 316, and another portion 314*a* of the second seed layer 314 is covered by the second trace layer 316. Following the step of removing a portion of the second seed layer 314, any remaining portion of the patterned photoresist layer 324 and second seed layer 314 can be removed or cleaned by such as plasma process and pickling process.

Figure 10G:
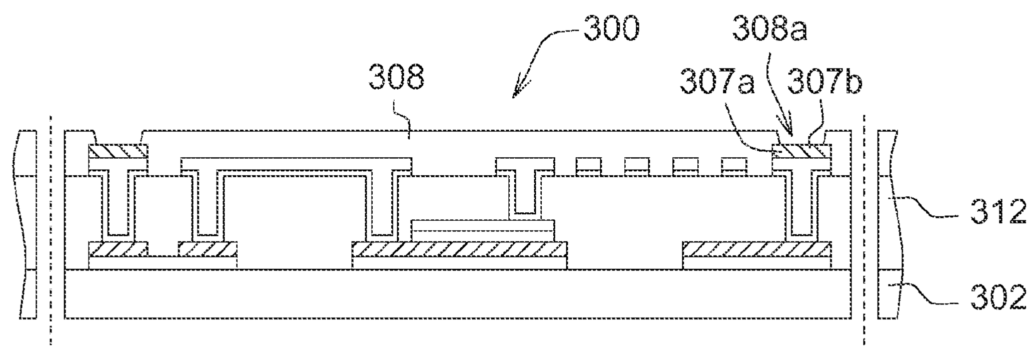

Referring to FIG. 10G, the first dielectric layer 308 is formed to cover the portion 307*a* of the first electrical contact 307, wherein, the first dielectric layer 308 has the first aperture 308*a* from which the another portion 307*b* of the first electrical contact 307 is exposed. The method for forming the first dielectric layer 308 is similar to that for forming the second dielectric layer 312, and the similarities are not repeated here. In FIG. 10G, at least the first dielectric layer 308, the second dielectric layer 312 and the insulator substrate 302 are singulated by tool or laser cutting technology to form at least the semiconductor structure 3.

Figure 11:
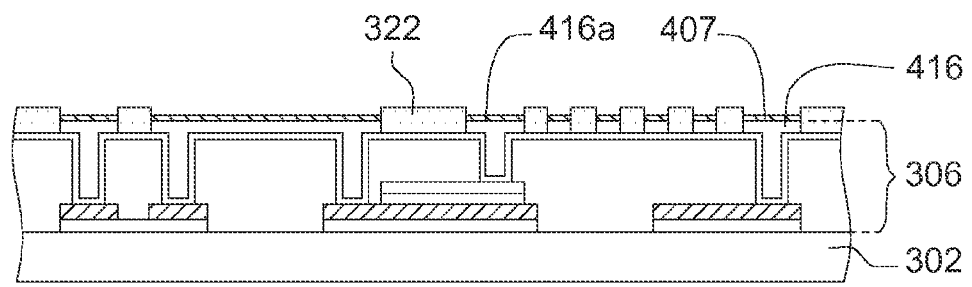
FIG. 11 illustrates a manufacturing process of the structure of FIG. 7.

Referring to FIG. 11, a manufacturing process of the semiconductor structure 4 is illustrated. In the manufacturing method of the semiconductor structure 4, the steps before the formation of the first electrical contact 407 are similar to manufacturing method of the semiconductor structure 3, and the similarities are not repeated here. The following descriptions start with the formation of the first electrical contact 407.

In FIG. 11, the first electrical contact 407 is formed on the passive element network 306. For example, the first electrical contact 407 covers the entire of the exposed top surface 416*a* of the second trace layer 416 of the passive element network 306. Furthermore, the patterned photoresist layer 322 used for forming the second trace layer 316 is used in the step of forming the first electrical contact 407, so that the first electrical contact 407 covers the entire of the exposed top surface 416*a*. Under such circumstances, the step of forming the second trace layer and the step of forming the first electrical contact share the same mask (that is, the manufacturing process of the semiconductor structure 4 can do without the patterned photoresist layer 324 of FIG. 10E), so that the manufacturing costs and processing time are reduced and the manufacturing efficiency is increased. After the first electrical contact 407 is formed, the patterned photoresist layer 322 of FIG. 11 is removed by such as stripping or etching technology.

Referring to FIGS. 12A~12D, a manufacturing process of the semiconductor structure 5 is illustrated. In the manufacturing method of the semiconductor structure 5, the steps before the formation of the first electrical contact 407 (illustrated in FIG. 9A) are similar to manufacturing method of the semiconductor structure 3 and semiconductor structure 4, and the similarities are not repeated here. The following descriptions start with the formation of the first dielectric layer 308.

Figure 12A:
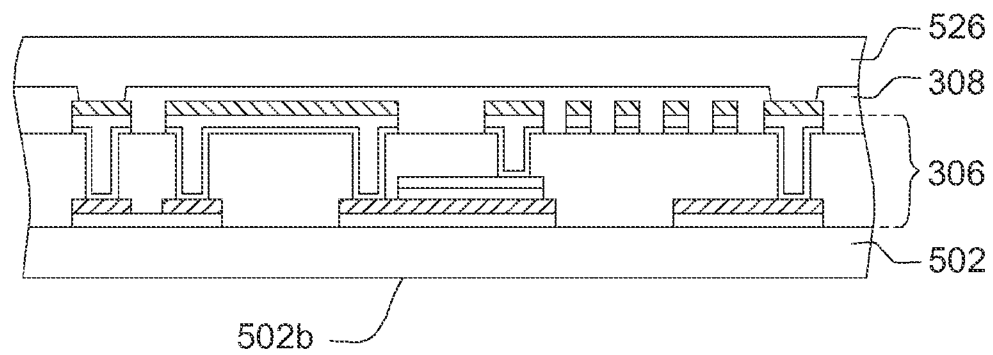
FIGS. 12A-12D illustrate the manufacturing process of the structure of FIG. 8.

Referring to FIG. 12A, a passive element network 306 is disposed on a carrier 526, wherein, the carrier 526 has an adhesive layer (not illustrated), and the passive element network 306 is adhered on the adhesive layer, so that the second surface 502*b* of the insulator substrate 502 faces outwards such as downwards. However, the forgoing description is meant to be illustrative and not limiting. In other implementations, the second surface 502*b* of the insulator substrate 502 can face any direction for processing.

Figure 12B:
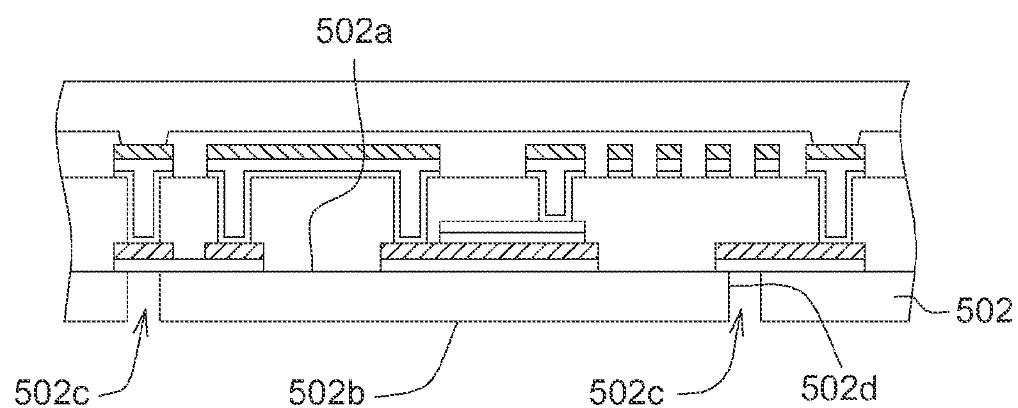

Referring to FIG. 12B, at least a first through hole 502*c* penetrating the insulator substrate 502 is formed by a suitable process such as, for example, laser technology, mechanical processing technology or chemical etching technology, such that the first through hole 502*c* is extended to the second surface 502*b* from the first surface 502*a* of the substrate 502. Following the formation of the first through hole 502*c*, the substrate 502 forms a first inner lateral wall 502*d* corresponding to the first through hole 502*c*. In another embodiment, prior to the formation of the first through hole 502*c*, the second surface 502*b* of the substrate 502 can be ground to reduce the thickness of the substrate 502.

Figure 12C:
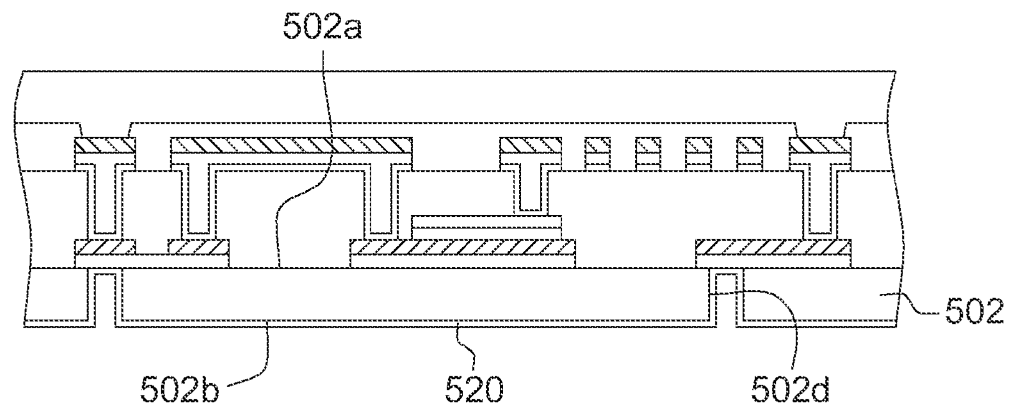

Referring to FIG. 12C, the first seed layer 520 is formed a process such as electroless plating or sputtering to cover the totality of the first inner lateral wall 502*d* and the second surface 502*b* of the insulator substrate 502.

Figure 12D:
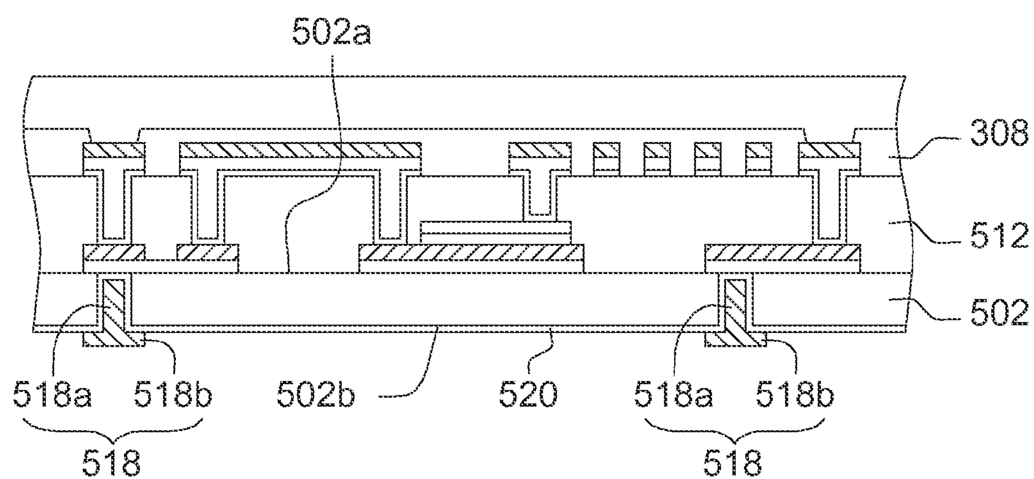

As shown in FIG. 12D, a second electrical contact 518 is formed in the first through hole 502*c*. Furthermore, the second electrical contact 518 can be formed on the first seed layer 520, the portion 518*a* of the second electrical contact 518 is extended to the interior of the first through hole 502*c*, and the another portion 518*b* of the second electrical contact 518 is formed adjacent to the second surface 502*b* of the insulator substrate 502, such as it is formed on the first seed layer 520 adjacent to the second surface 502*b*. Then, at least the first dielectric layer 308, a second dielectric layer 512 and the substrate 502 are singulated to form the semiconductor structure 5.

Figure 13:
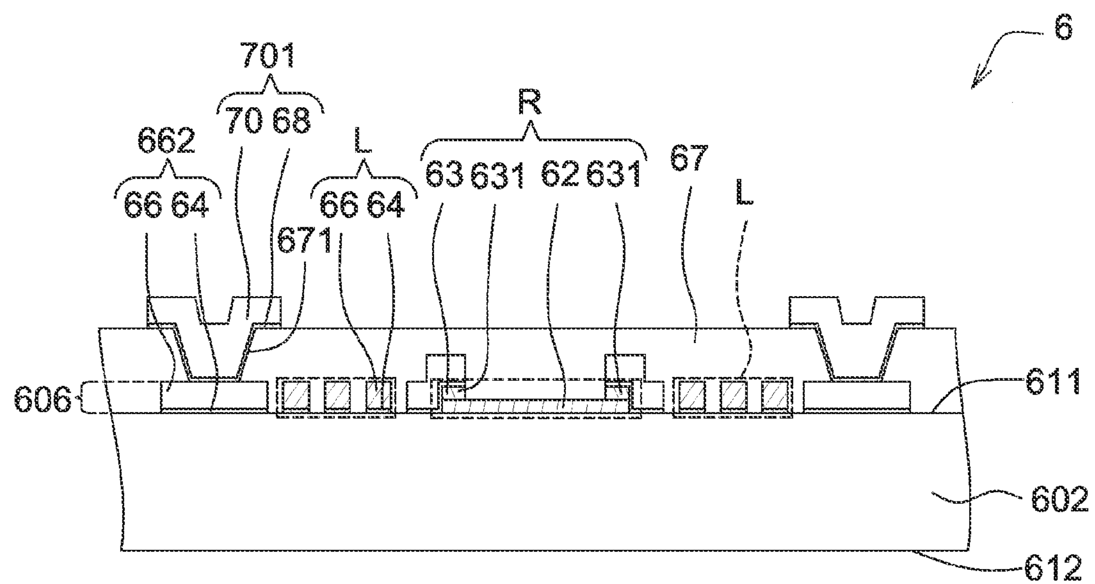
FIG. 13 illustrates a cross-sectional view of a semiconductor structure according to another embodiment of the invention.

Referring to FIG. 13, a cross-sectional view of a semiconductor structure 6, according to an embodiment of the present invention, is illustrated. The semiconductor structure 6 comprises a substrate 602, a passive element network 606 (including a resistor R and an inductor L), a connection pad 662, a first protection layer 67 and a first under bump metallurgy (UBM) 701.

As shown in FIG. 13, the substrate 602 has a first surface 611 and a second surface 612. In this embodiment, the substrate 602 is a glass substrate.

In FIG. 13, the resistor R is disposed adjacent to the first surface 611 of the substrate 602, and has a first metal 62 and electrodes 631. The first metal 62 is a resistance layer. The electrodes 631 are disposed on the first metal 62 and spaced apart to each other. The electrodes 631 are formed from a second metal 63. In this embodiment, the first metal 62 of the resistor R is disposed on the first surface 611 of the substrate 602 directly. The material of the first metal 62 is tantalum nitride, and the material of the second metal 63 is aluminum copper or titanium.

Figure 16:
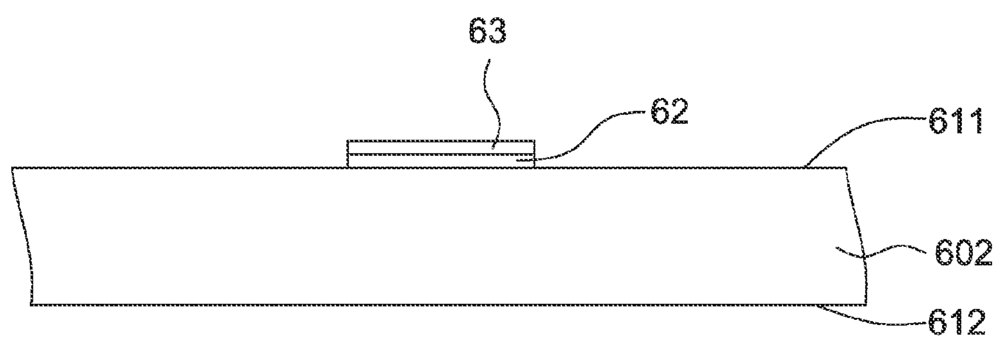

In FIG. 13, the inductor L is disposed adjacent to the first surface 611 of the substrate 602, and electrically connected to the resistor R. The bottom surface of the inductor L is substantially coplanar with the bottom surface of the first metal 62 of the resistor R. In this embodiment, the inductor L is disposed on the first surface 611 of the substrate 602 directly, and on the side of the resistor R. The inductor L comprises a third metal 66 and a first seed layer 64. The material of the third metal 66 is copper, and the material of the first seed layer 64 is tantalum nitride. However, the first seed layer 64 may be omitted, that is, the third metal 66 at this position is the inductor L. In addition, as shown in FIG. 16, the inductor L contacts the first metal 62 and the electrode 631 of the resistor R at the same time, and one end of the inductor L further extends to the top surface of the electrode 631.

In FIG. 13, the connection pad 662 is disposed adjacent to the first surface 611 of the substrate 602, and electrically connected to the inductor L. The connection pad 662 provides the electrical connection in vertical direction. In this embodiment, the connection pad 662 is disposed on the first surface 611 of the substrate 602 directly. The bottom surface of the connection pad 662 is coplanar with the bottom surface of the first metal 62 of the resistor R. The connection pad 662 and the inductor L are on the same layer. Thus, the connection pad 662 comprises a third metal 66 and the first seed layer 64. The material of the third metal 66 is copper, and the material of the first seed layer 64 is tantalum nitride. However, the first seed layer 64 may be omitted, that is, the third metal 66 at this position would be the connection pad 662.

In FIG. 13, the first protection layer 67 covers the resistor R and the inductor L, and has at least one opening 671 to expose the connection pad 662. A part of the first protection layer 67 contacts the first metal 62 and the first surface 611 of the substrate 602 directly. The material of the first protection layer 67 is polyimide (PI) or polypropylene (PP).

In FIG. 13, the first under bump metallurgy (UBM) 701 is disposed in the opening 671 of the first protection layer 67 so as to electrically connect the connection pad 662. In this embodiment, the first under bump metallurgy (UBM) 701 further extends to the top surface of the first protection layer 67. The first under bump metallurgy (UBM) 701 comprises a fourth metal 70 and a second seed layer 68. The fourth metal 70 is a single layer or multi layer structure, and the material of the second seed layer 68 is tantalum nitride. However, the second seed layer 68 may be omitted, that is, the fourth metal 70 at this position is the first under bump metallurgy (UBM) 701.

Referring to FIGS. 14 to 19, a method for making the semiconductor structure 6, according to an embodiment of the present invention, is illustrated.

Figure 14:
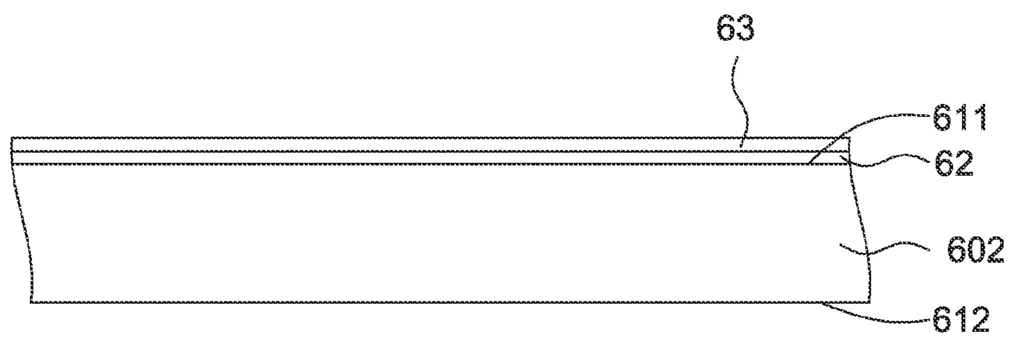
FIGS. 14 to 19 illustrate the manufacturing process of the structure of FIG. 13.

Referring to FIG. 14, the substrate 602 is provided. The substrate 602 has the first surface 611 and the second surface 612. In this embodiment, the substrate 602 is a glass substrate. Then, a first metal 62 is formed on the first surface 611 of the substrate 602, and a second metal 63 is formed on the first metal 62. In this embodiment, the first metal 62 is disposed on the first surface 611 of the substrate 602 directly. The material of the first metal 62 is tantalum nitride, and the material of the second metal 63 is aluminum copper or titanium.

Figure 15:
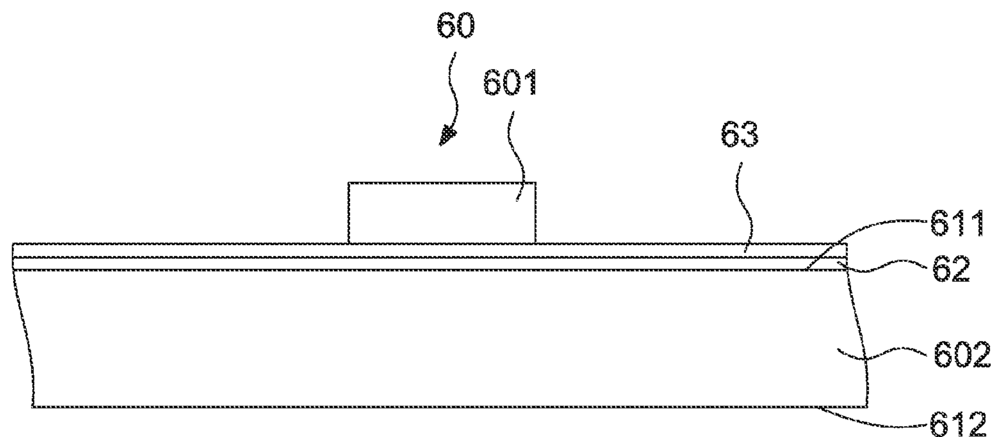

Referring to FIG. 15, a first photoresist layer 60 is formed on the second metal 63. Then, a part of the first photoresist layer 60 is removed, so that the first photoresist layer 60 has a remaining portion 601 to cover a part of the second metal 63.

Referring to FIG. 16, the first metal 62 and the second metal 63 that are not covered by the remained portion 601 are removed. Then, the first photoresist layer 60 is removed completely.

Figure 17:
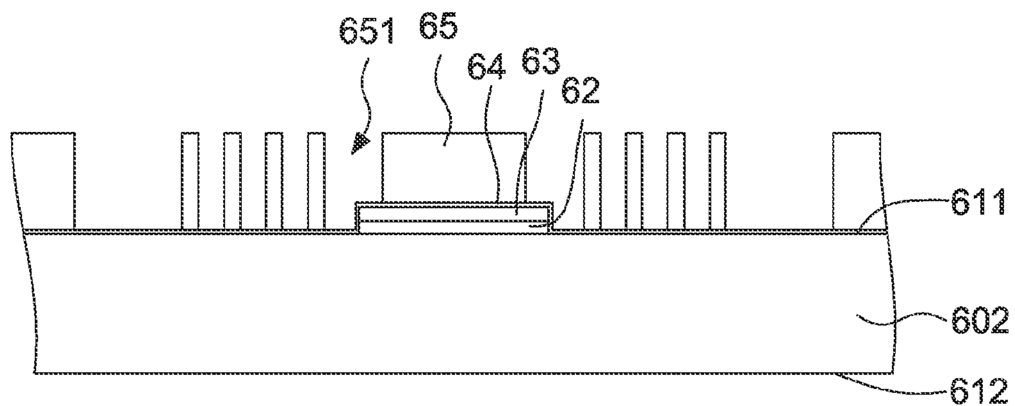

Referring to FIG. 17, preferably, the first seed layer 64 is formed on the first surface 611 of the substrate 602 and the first metal 62. The material of the first seed layer 64 is tantalum nitride. Then, a second photoresist layer 65 is formed. The second photoresist layer 65 has at least one opening 651. In this embodiment, the opening 651 is a spiral appearance from top view, and one end of the opening 651 corresponds to a corner of the second metal 63.

Figure 18:
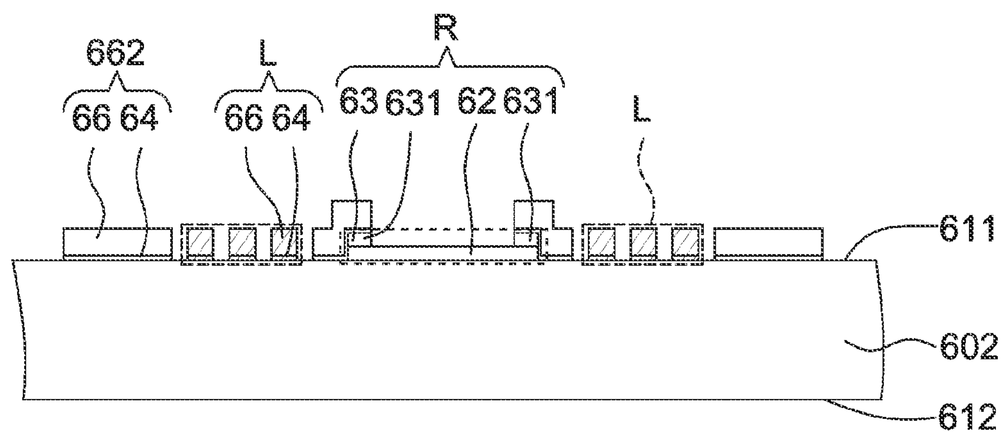

Referring to FIG. 18, a third metal 66 is formed in the opening 651 of the second photoresist layer 65. In this embodiment, the material of the third metal 66 is copper. Then, the second photoresist layer 65 is removed. Then, the first seed layer 64 that is not covered by the third metal 66 is removed, so that the third metal 66 forms an inductor L and a connection pad 662. Meanwhile, a part of the second metal 63 is removed to form the two electrodes 631 that are spaced apart to each other, and a resistor R is formed by the first metal 62 and the electrodes 631. The inductor L is electrically connected to the connection pad 662 and at least one of the electrodes 631. In this embodiment, the bottom surfaces of the inductor L and the connection pad 662 are substantially coplanar with the bottom surface of the first metal 62 of the resistor R. The inductor L and the connection pad 662 are disposed on the first surface 611 of the substrate 602 directly, and on the side of the resistor R. The inductor L and the connection pad 662 comprise the third metal 66 and the first seed layer 64. However, the first seed layer 64 may be omitted, that is, the third metal 66 at this position is the inductor L and the connection pad 662. Thus, the step of removing the first seed layer 64 is omitted. In addition, the inductor L contacts the first metal 62 and the second metal 63 at the same time, and one end of the inductor L further extends to the top surface of the second metal 63.

Figure 19:
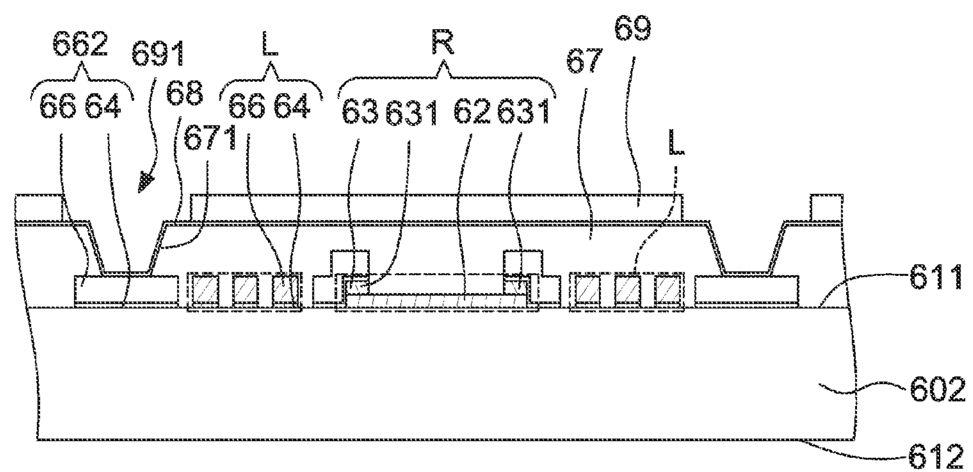

Referring to FIG. 19, the first protection layer 67 is formed on the resistor R and the inductor L. The first protection layer 67 has at least one opening 671 to expose the connection pad 662. A part of the first protection layer 67 contacts the first metal 62 and the first surface 611 of the substrate 602 directly.

Preferably, a second seed layer 68 is formed on the first protection layer 67 and in its opening 671 to contact the connection pad 662. In this embodiment, the material of the second seed layer 68 is tantalum nitride. Then, a third photoresist layer 69 is formed on the second seed layer 68. The third photoresist layer 69 has at least one opening 691 which corresponds to the opening 671 of the first protection layer 67. The size of the opening 691 of the third photoresist layer 69 is larger than that of the opening 671 of the first protection layer 67.

Then, a fourth metal 70 is formed in the opening 671 of the first protection layer 67 so as to form a first under bump metallurgy (UBM) 701, and obtain the semiconductor structure 6. The first under bump metallurgy (UBM) 701 is electrically connected to the connection pad 662. In this embodiment, the fourth metal 70 is a single layer or multi layer structure, and is formed on the second seed layer 68 that is disposed in the opening 671 of the first protection layer 67. Then, the third photoresist layer 69 and the second seed layer 68 that is not covered by the fourth metal 70 are removed, so that the first under bump metallurgy (UBM) 701 comprises the fourth metal 70 and the second seed layer 68. However, the second seed layer 68 may be omitted, that is, the fourth metal 70 at this position is the first under bump metallurgy (UBM) 701. Thus, the step of removing the second seed layer 68 is omitted. In addition, the first under bump metallurgy (UBM) 701 further extends to the top surface of the first protection layer 67. In this embodiment, the inductor L and the connection pad 662 are on the same layer, and the resistor R is defined after the inductor L is formed, which can simplify the manufacture process and save the cost. In addition, the thickness of the semiconductor device 6 is reduced effectively since the bottom surface of the inductor L is coplanar with the bottom surface of the first metal 62.

Figure 20:
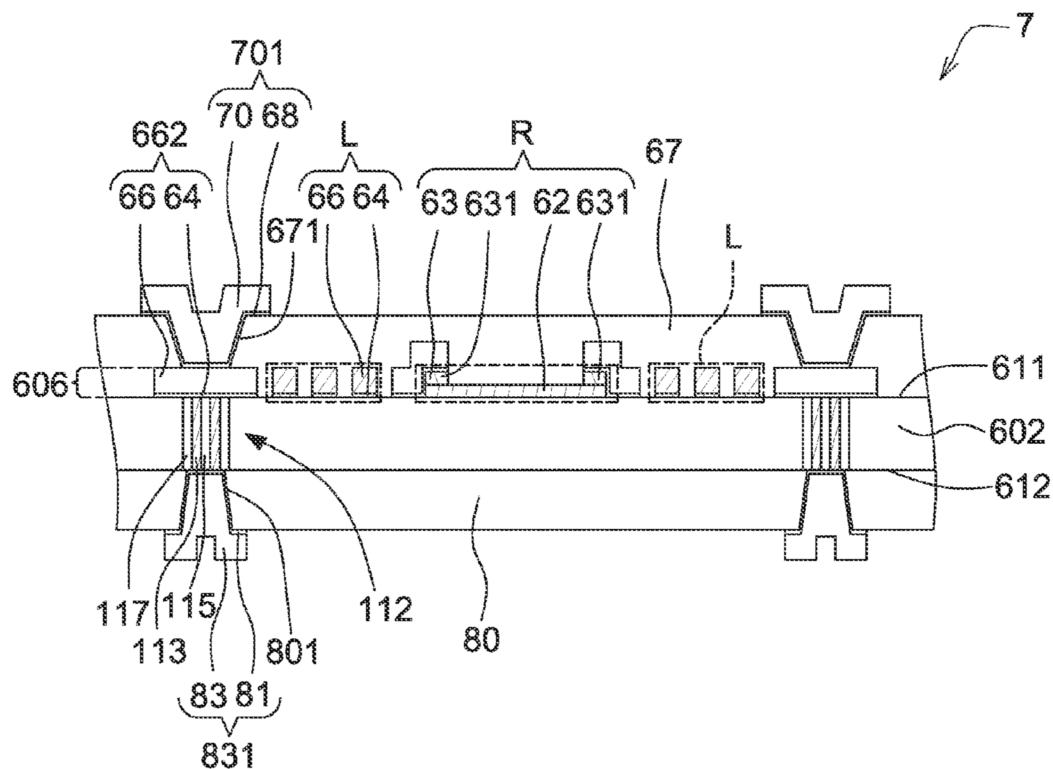
FIG. 20 illustrates a cross-sectional view of a semiconductor structure according to another embodiment of the invention.

Referring to FIG. 20, a cross-sectional view of a semiconductor structure 7, according to another embodiment of the present invention, is illustrated. The semiconductor structure 7 of this embodiment is substantially the same as the semiconductor structure 6, and the same elements are designated with same reference numerals. The difference between the semiconductor structure 7 of this embodiment and the semiconductor structure 6 is that the semiconductor structure 7 further comprises a second protection layer 80 and a second under bump metallurgy (UBM) 831, and the substrate 602 further has at least one conductive via 112.

In FIG. 20, the conductive via 112 is exposed to the first surface 611 and the second surface 612 of the substrate 602, and the connection pad 662 is electrically connected to the conductive via 112. In this embodiment, the conductive via 112 has a central insulation material 115, an interconnection metal 113 and an outer insulation material 117. The interconnection metal 113 is annular, and is disposed between the central insulation material 115 and the outer insulation material 117. The second protection layer 80 is disposed on the second surface 612 of the substrate 602, and has at least one opening 801 to expose the conductive via 112. The second under bump metallurgy (UBM) 831 is disposed in the opening 801 of the second protection layer 80 so as to electrically connect the conductive via 112. The material of the second protection layer 80 is the same as that of the first protection layer 67.

In FIG. 20, in this embodiment, the second under bump metallurgy (UBM) 831 further extends to the top surface of the second protection layer 80, and comprises a fifth metal 83 and a third seed layer 81. The fifth metal 83 is a single layer or multi layer structure, and the material of the third seed layer 81 is tantalum nitride. However, the third seed layer 81 may be omitted, that is, the fifth metal 83 at this position can be the second under bump metallurgy (UBM) 831.

Referring to FIGS. 21 to 25, a method for making the semiconductor structure 7, according to an embodiment of the present invention. is illustrated. The method of this embodiment is substantially the same as the method of FIGS. 13 to 19, the difference being that the method of this embodiment further comprises a step of forming at least one conductive via 112 in the substrate 602, as described below.

Figure 21:
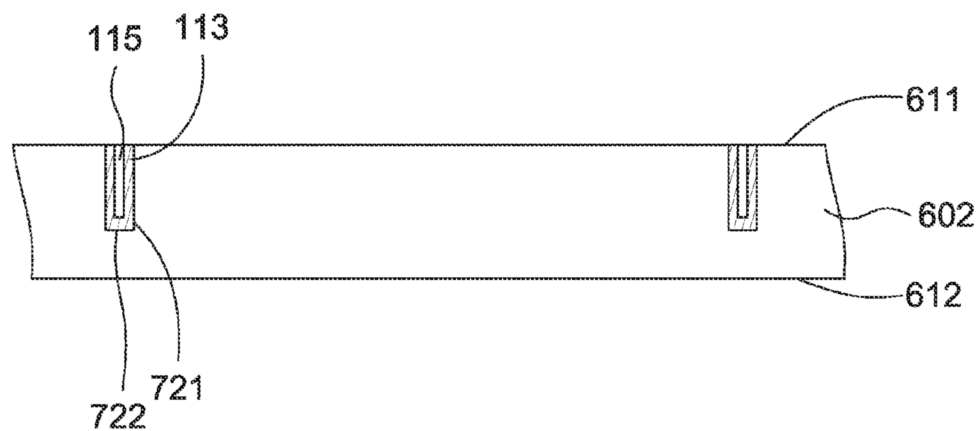
FIGS. 21 to 25 illustrate the manufacturing process of the structure of FIG. 20.

Referring to FIG. 21, a photoresist layer is formed on the first surface 611 of the substrate 602, wherein the photoresist layer has an opening. Then, the substrate 602 is etched according to the opening of the photoresist layer, so that an opening is formed on the first surface 611 of the substrate 602. The opening has a side wall 721 and a bottom surface 722. An interconnection metal 113 is formed on the side wall 721 and the bottom surface 722 of the opening, which defines a central opening. Then, the interconnection metal 113 that is disposed on the first surface 611 of the substrate 602 is removed. Then, an insulation material 115 is formed on the first surface 611 of the substrate 602 and in the central opening. Then, the insulation material 115 that is disposed on the first surface 611 of the substrate 602 is removed, so that the insulation material 115 remaining in the opening is defined as a central insulation material 115.

Figure 22:
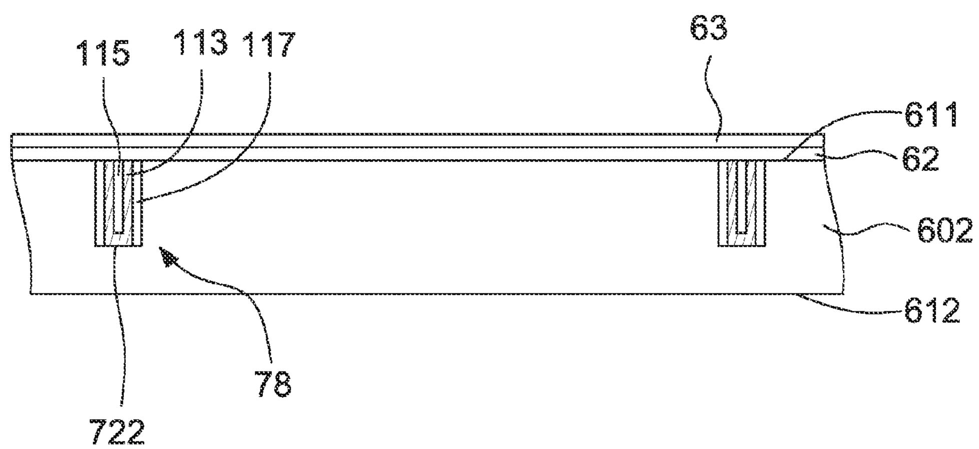

Referring to FIG. 22, an annular opening is formed on the first surface 611 of the substrate 602. The annular opening surrounds the interconnection metal 113. Then, the outer insulation material 117 is formed on the first surface 611 of the substrate 602 and in the annular opening. Then, the outer insulation material 117 that is disposed on the first surface 611 of the substrate 602 is removed, so that the insulation material 115 remained in the annular opening is defined as an outer insulation material 117, and a conductive via 112 is formed. Then, the first metal 62 is formed on the first surface 611 of the substrate 602, and the second metal 63 is formed on the first metal 62, wherein the first metal 62 contacts the conductive via 112.

Figure 23:
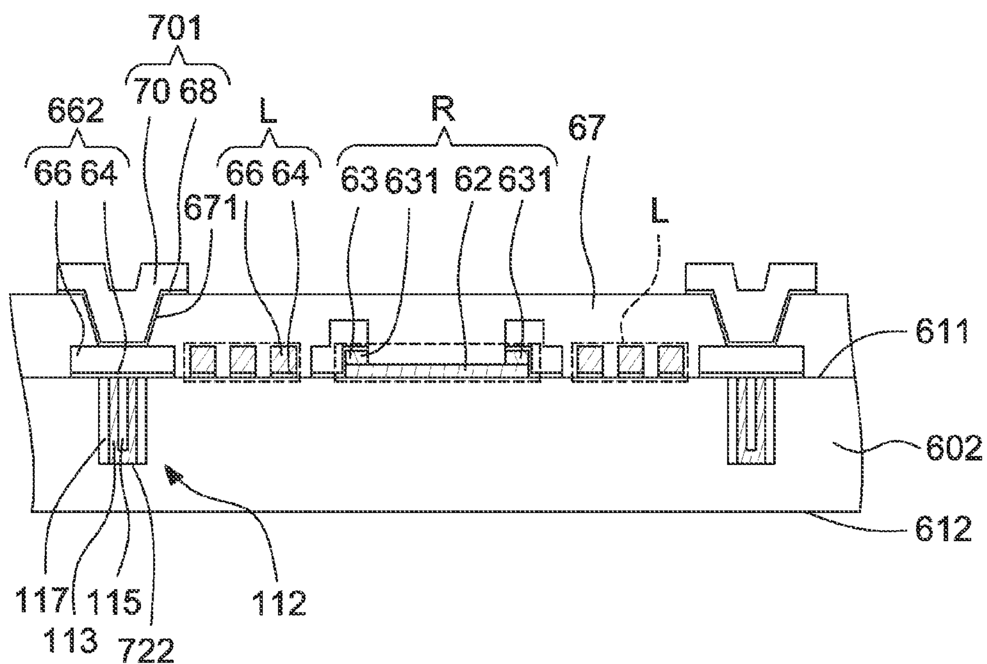

Referring to FIG. 23, the subsequent steps of this embodiment is the same as the steps of FIGS. 14 to 19, so that the inductor L, the connection pad 662, the resistor R, the first protection layer 67 and the first under bump metallurgy (UBM) 701 are formed in sequence.

Figure 24:
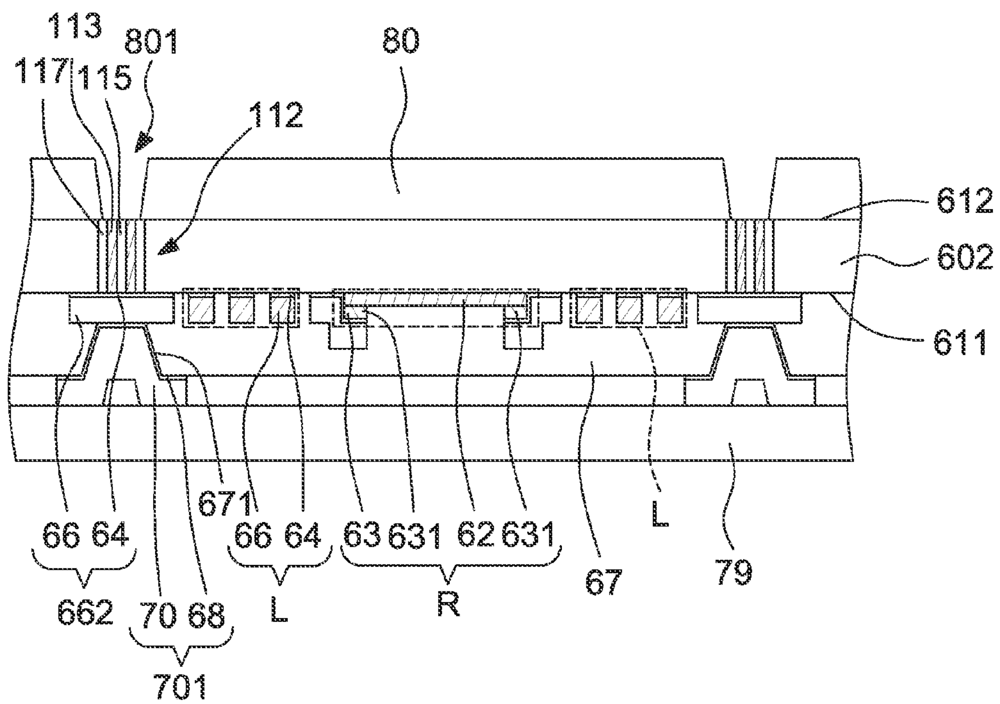

Referring to FIG. 24, a carrier 79 is provided, and the substrate 602 is attached to the carrier 79, wherein the first surface 611 of the substrate 602 faces the carrier 79. Then, the substrate 602 is thinned from the second surface 612 thereof by etching or grinding so as to remove a part of the substrate 602 and expose the conductive via 112. A second protection layer 80 is formed on the second surface 612 of the substrate 602, and has at least one opening 801 to expose the conductive via 112. The second protection layer 80 contacts the second surface 612 of the substrate 602 directly.

Figure 25:
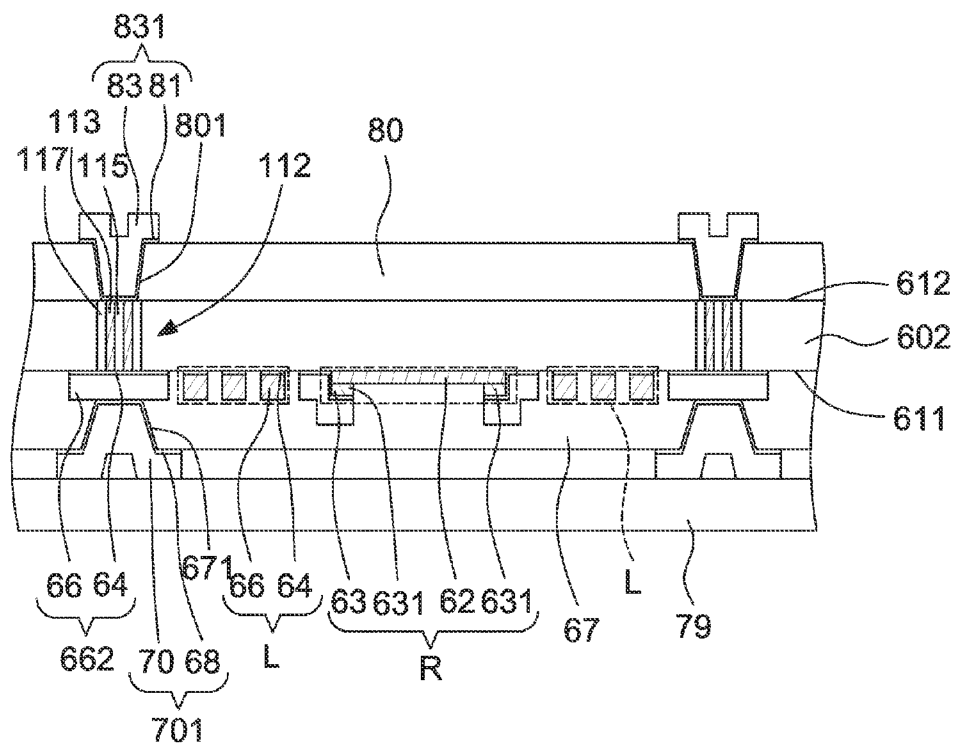

Referring to FIG. 25, preferably, a third seed layer 81 is formed on the second protection layer 80 and in its opening 801 to contact the conductive via 112. In this embodiment, the material of the third seed layer 81 is tantalum nitride. Then, a fourth photoresist layer 82 is formed on the third seed layer

81. The fourth photoresist layer 82 has at least one opening 821 which corresponds to the opening 801 of the second protection layer 80. The size of the opening 821 of the fourth photoresist layer 82 is larger than that of the opening 801 of the second protection layer 80.

Referring to FIG. 25, a fifth metal 83 is formed in the opening 801 of the second protection layer 80 so as to form a second under bump metallurgy (UBM) 831 electrically connected to the conductive via 112. In this embodiment, the fifth metal 83 is a single layer or multi layer structure, and is formed on the third seed layer 81 that is disposed in the opening 801 of the second protection layer 80. Then, the fourth photoresist layer 82 and the third seed layer 81 that is not covered by the fifth metal 83 are removed, so that the second under bump metallurgy (UBM) 831 comprises the fifth metal 83 and the third seed layer 81. However, the third seed layer 81 may be omitted, that is, the fifth metal 83 at this position is the second under bump metallurgy (UBM) 831. Thus, the step of removing the third seed layer 81 is omitted. In addition, the second under bump metallurgy (UBM) 831 further extends to the top surface of the second protection layer 80.

Figure 26:
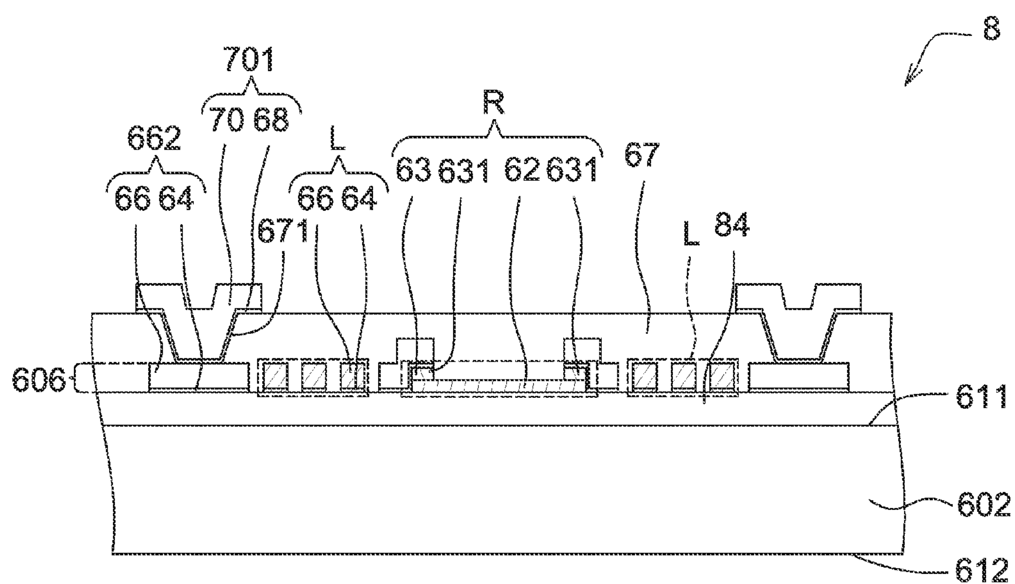
FIG. 26 illustrates a cross-sectional view of a semiconductor structure another embodiment of the invention.

Referring to FIG. 26, a cross-sectional view of a semiconductor structure 8, according to another embodiment of the present invention, is illustrated. The semiconductor structure 8 of this embodiment is substantially the same as the semiconductor structure 6, and the same elements are designated with same reference numerals. The difference between the semiconductor structure 8 of this embodiment and the semiconductor structure 6 is that the substrate 602 of the semiconductor structure 8 is a silicon substrate, and the semiconductor structure 8 further includes an insulation layer 84. The insulation layer 84 is disposed on the first surface 611 of the substrate 602, and the first metal 62 of the resistor R, the first seed layer 64 of the inductor L and the first seed layer 64 of the connection pad 662 are disposed on the insulation layer 84.

Figure 27:
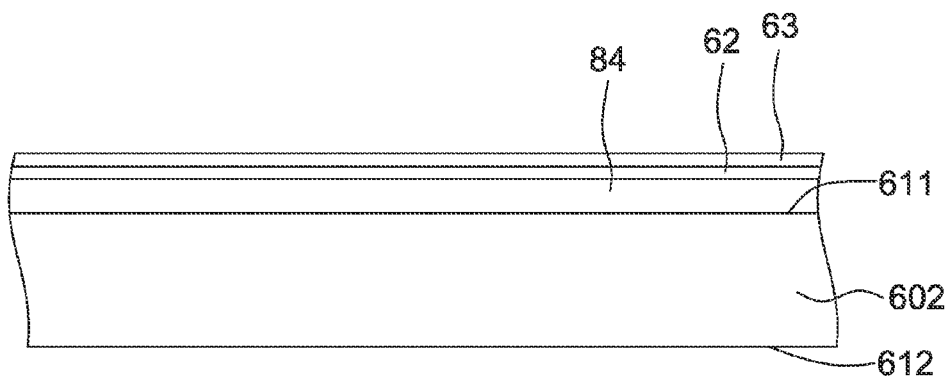
FIG. 27 illustrates the manufacturing process of the structure of FIG. 26.

Referring to FIG. 27, a method for making the semiconductor structure 8, according to an embodiment of the present invention, is illustrated. The method of this embodiment is substantially the same as the method of FIGS. 13 to 19, the difference described as follows.

Referring to FIG. 27, the method of this embodiment further comprises a step of forming an insulation layer 84 on the first surface 611 of the substrate 602 before the step of FIG. 14. The first metal 62 is formed on the insulation layer 84, and the second metal 63 is formed on the first metal 62. Then, the subsequent steps of this embodiment is the same as the steps of FIGS. 14 to 19, so that the inductor L, the connection pad 662, the resistor R, the first protection layer 67 and the first under bump metallurgy (UBM) 701 are formed in sequence, and the semiconductor device 8 is obtained, as shown in FIG. 26.

Figure 28:
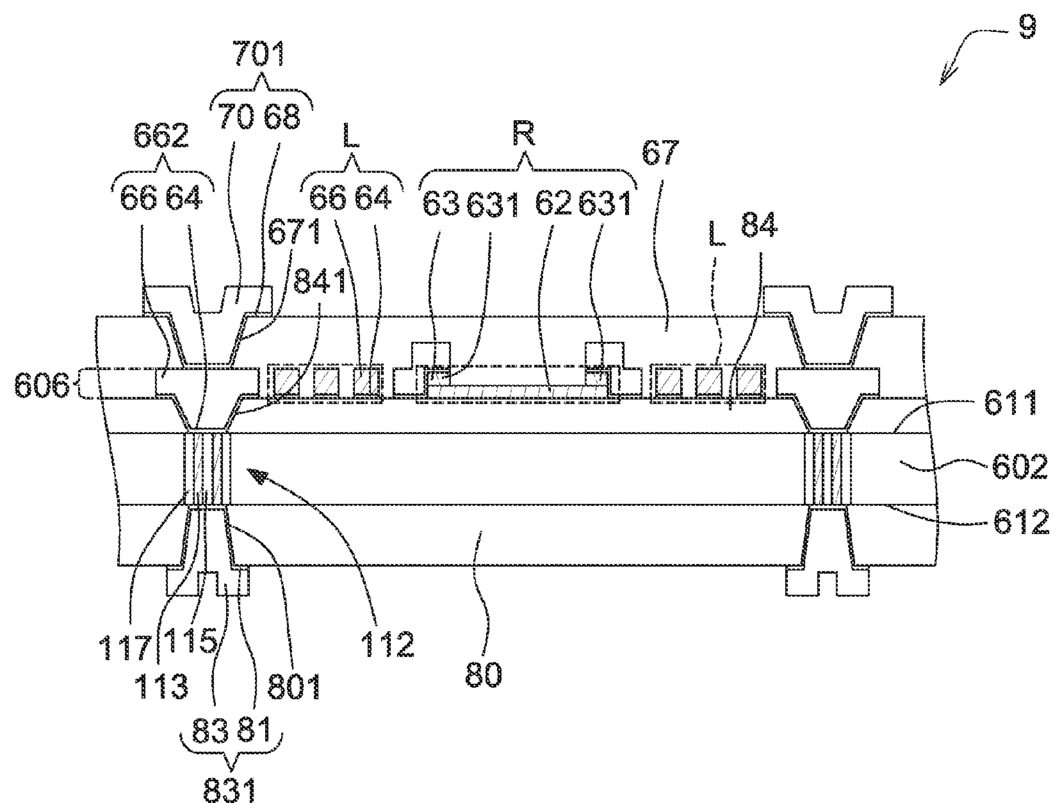
FIG. 28 illustrates a cross-sectional view of a semiconductor structure according to another embodiment of the invention.

Referring to FIG. 28, a cross-sectional view of a semiconductor structure 9, according to another embodiment of the present invention, is illustrated. The semiconductor structure 9 of this embodiment is substantially the same as the semiconductor structure 7, and the same elements are designated with same reference numerals. The difference between the semiconductor device 9 of this embodiment and the semiconductor device 7 of FIG. 20 is that the substrate 602 of the semiconductor device 9 is a silicon substrate, and the semiconductor device 9 further comprises an insulation layer 84. The insulation layer 84 is disposed on the first surface 611 of the substrate 602, and has at least one opening 841 to expose the conductive via 112. The connection pad 662 is disposed in the opening 841 of the insulation layer 84 to electrically connect the conductive via 112. The first metal 62 of the resistor R, the first seed layer 64 of the inductor L and the first seed layer 64 of the connection pad 662 are disposed on the insulation layer 84.

Figure 29:
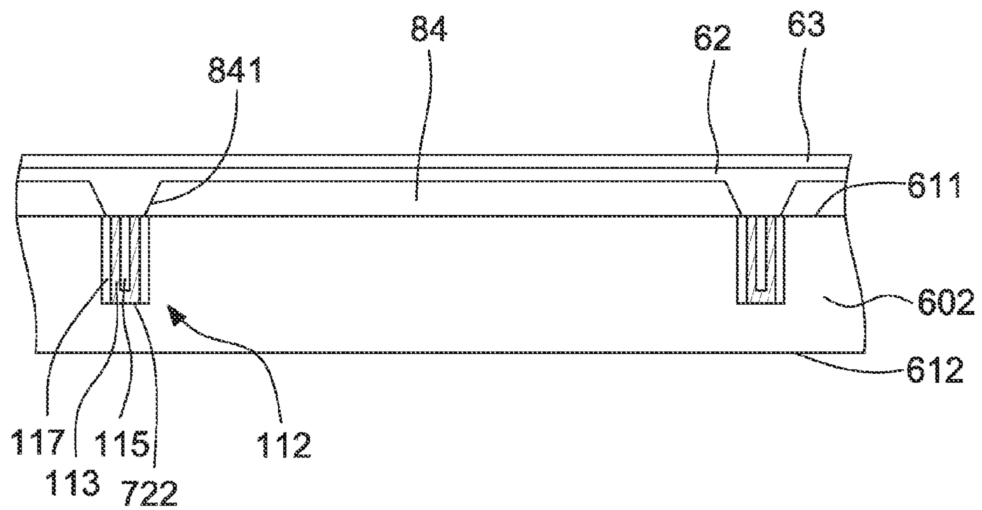
FIG. 29 illustrates the manufacturing process of the structure of FIG. 28.

Referring to FIG. 29, a method for making the semiconductor device 9, according to an embodiment of the present invention, is illustrated. The method of this embodiment is substantially the same as the method of FIGS. 21 to 25, the difference described as follows.

Referring to FIG. 29, the method of this embodiment further comprises a step of forming an insulation layer 84 on the first surface 611 of the substrate 602 before the step of FIG. 14. The insulation layer 84 has at least one opening 841 to expose the conductive via 112. The first metal 62 is formed on the insulation layer 84 and in its opening 841, and the second metal 63 is formed on the first metal 62. Then, the subsequent steps of this embodiment is the same as the steps of FIGS. 21 to 25, so that the inductor L, the connection pad 662, the resistor R, the first protection layer 67 and the first under bump metallurgy (UBM) 701 are formed in sequence, and the semiconductor device 9 is obtained, as shown in FIG. 28. In this embodiment, the connection pad 662 is formed in the opening 841 of the insulation layer 84 so to electrically connect the conductive via 112.

Figure 30:
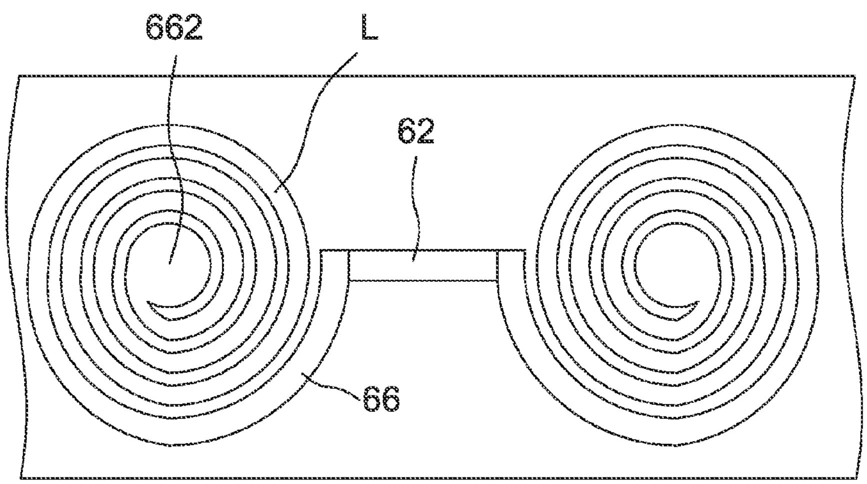
FIG. 30 illustrates a cross sectional view of the resistor and the inductor of the semiconductor device of FIG. 28.

Referring to FIG. 30, a cross sectional view of the resistor and the inductor of the semiconductor device of FIG. 28 is illustrated. The passive element network 606 of the semiconductor structure 9 includes a resistor R (FIG. 28), two inductors 661 and two connection pads 662. Each of the inductors 661 has a spiral appearance from a top view, and surrounds each of the connection pads 662. Each of the inductors 661 is connected to the electrode 631 of the resistor R, as shown.

Figure 31:
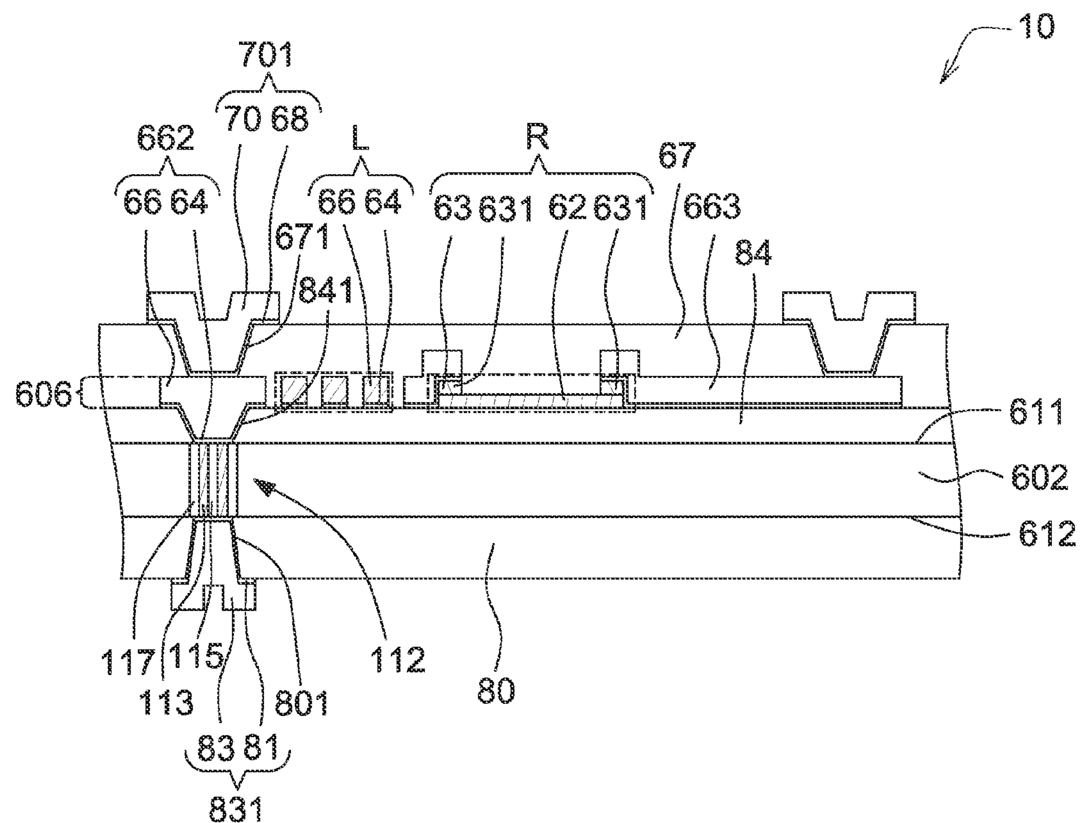
FIG. 31 illustrates a cross-sectional view of a semiconductor structure according to another embodiment of the invention.

Referring to FIG. 31, a cross-sectional view of a semiconductor structure 10, according to another embodiment of the present invention, is illustrated. The semiconductor structure 10 of this embodiment is substantially the same as the semiconductor device 9, and the same elements are designated with same reference numerals. The difference between the semiconductor structure 10 of this embodiment and the semiconductor structure 9 is that the semiconductor structure 10 only includes inductors 661 and a connection pad 662, as shown in the left side of the figure. In addition, the semiconductor device 10 further includes a connecting trace 663. One end of the connecting trace 663 is connected to the electrode 631 of the resistor R, and the other end is capable of vertical electrical connection.

Figure 32:
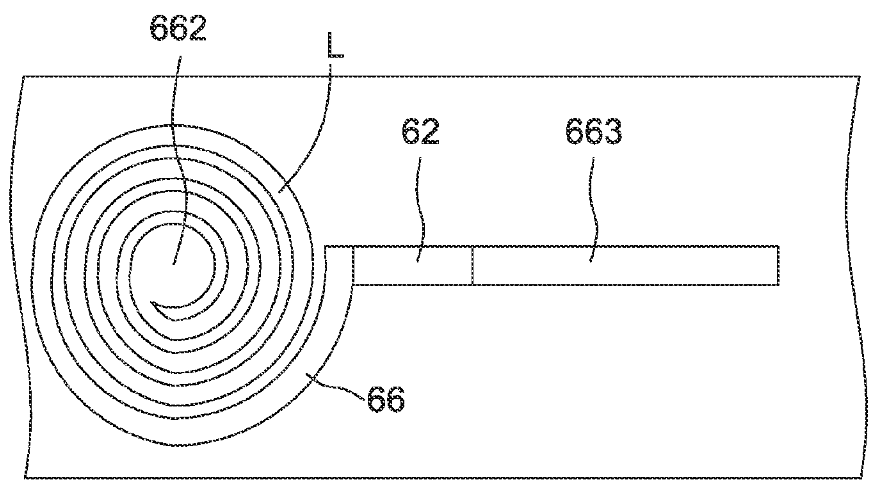
FIG. 32 illustrates a cross sectional view of the resistor and the inductor of the semiconductor structure of FIG. 31.

Referring to FIG. 32, a cross sectional view of the resistor and the inductor of the semiconductor structure of FIG. 31 is illustrated. The semiconductor structure 10 comprises the passive element network 606 including a resistor R (FIG. 31), a inductor L, a connection pad 662 and a connecting trace 663. The inductor L is spiral in appearance from a top view, and surrounds the connection pad 662. The inductor L is connected to the electrode 631 of the resistor R. One end of the connecting trace 663 is connected to the electrode 631 of the resistor R, and the other end is capable of vertical electrical connection.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor structure, comprising:

a substrate including a conductive via formed therein;

a first dielectric layer disposed on a surface of the substrate, the first dielectric layer having an opening extending from an upper surface of the first dielectric layer to the surface of the substrate; and a passive element network disposed adjacent to the first dielectric layer and electrically connected to the conductive via through the opening;

wherein the passive element network includes a first inductor, a second inductor, and a common resistor electrically connected with the first inductor and the second inductor; and wherein the passive element network includes a plurality of patterned layers, a first one of the patterned layers including a first portion used to form part of the resistor and a second portion used to form part of a capacitor, the first portion and the second portion made of the same material.

2. The semiconductor structure of claim 1, wherein the patterned layers includes a plurality of patterned dielectric and conductive layers.

3. The semiconductor structure of claim 1, wherein the capacitor is electrically connected with the common resistor.

4. The semiconductor structure of claim 3, wherein the passive element network further comprises a second capacitor that is electrically connected with the common resistor.

5. The semiconductor structure of claim 1, wherein the opening in the first dielectric layer is a substantially straight hole.

6. The semiconductor structure of claim 1, wherein the semiconductor structure is an interposer.

7. The semiconductor structure of claim 1, further comprising a redistribution layer disposed on the passive element network and electrically connected to the passive element network and the conductive via.

8. The semiconductor structure of claim 7, wherein the redistribution layer includes a plurality of patterned dielectric and conductive layers.

9. The semiconductor structure of claim 7, wherein the redistribution layer includes an inductor.

10. The semiconductor structure of claim 1, further including a second dielectric layer disposed adjacent the passive network, the second dielectric layer including an opening, the passive element network electrically connected to the conductive via through the opening in the second dielectric layer and the opening in the first dielectric layer.

11. A semiconductor structure, comprising:

a substrate including a conductive via formed therein;

a first dielectric layer disposed on a surface of the substrate, the first dielectric layer having an opening extending from an upper surface of the first dielectric layer to the surface of the substrate; and a passive element network disposed adjacent to the first dielectric layer and electrically connected to the conductive via through the opening;

wherein the passive element network includes:

a first metal layer formed on the dielectric layer;

a second metal layer formed on the first metal layer;

a capacitor dielectric layer formed on the second metal layer; and a third metal layer formed on the capacitor dielectric layer;

wherein, the first metal layer and the second metal layer form at least a resistor structure, and the second metal layer, the capacitor dielectric layer and the third metal layer form at least a capacitor structure.

12. The semiconductor structure of claim 11, wherein the semiconductor structure is an interposer.

13. The semiconductor structure of claim 11, further comprising a redistribution layer disposed on the passive element network and electrically connected to the passive element network and the conductive via.

14. The semiconductor structure of claim 13, wherein the redistribution layer includes a plurality of patterned dielectric and conductive layers.

15. The semiconductor structure of claim 13, wherein the redistribution layer includes an inductor.

16. The semiconductor structure of claim 11, further including a second dielectric layer disposed adjacent the passive network, the second dielectric layer including an opening, the passive element network electrically connected to the conductive via through the opening in the second dielectric layer and the opening in the first dielectric layer.

17. A method for making a semiconductor structure, comprising:

providing a substrate;

forming a conductive via in the substrate;

forming a dielectric layer in the substrate;

forming a passive element network on the first dielectric layer; and forming a redistribution layer;

wherein the passive network includes a first inductor, a second inductor, and a common resistor electrically connected with the first inductor and the second inductor; and wherein the passive element network includes a plurality of patterned layers, a first one of the patterned layers including a first portion used to form part of the resistor and a second portion used to form part of a capacitor, the first portion and the second portion made of the same material.

18. The method for making a semiconductor structure of claim 17, wherein the patterned layers include a plurality of patterned dielectric and conductive layers.

19. The method for making a semiconductor structure of claim 17, further comprising forming a redistribution layer disposed on the passive element network and electrically connected to the passive element network and the conductive via.

20. The method for making a semiconductor structure of claim 17, further comprising forming a second dielectric layer disposed adjacent the passive network, the second dielectric layer including an opening, the passive element network electrically connected to the conductive via through the opening in the second dielectric layer and the opening in the first dielectric layer.

* * * * *